(12) United States Patent
Kondo et al.

(10) Patent No.: US 11,922,030 B2
(45) Date of Patent: Mar. 5, 2024

(54) TEMPERATURE SENSOR MANAGEMENT IN NONVOLATILE DIE-STACKED MEMORY

(71) Applicant: Kioxia Corporation, Tokyo (JP)

(72) Inventors: Atsushi Kondo, Yokohama (JP); Ryo Yonezawa, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/931,699

(22) Filed: Sep. 13, 2022

(65) Prior Publication Data
US 2023/0004310 A1 Jan. 5, 2023

Related U.S. Application Data

(63) Continuation of application No. PCT/JP2020/046533, filed on Dec. 14, 2020.

(30) Foreign Application Priority Data

Apr. 27, 2020 (JP) .................................. 2020-078368

(51) Int. Cl.
*G06F 3/06* (2006.01)

(52) U.S. Cl.
CPC .......... *G06F 3/0619* (2013.01); *G06F 3/0653* (2013.01); *G06F 3/0679* (2013.01)

(58) Field of Classification Search
CPC ....................................................... G06F 3/06
See application file for complete search history.

(56) References Cited

U.S. PATENT DOCUMENTS

| 8,209,504 B2 | 6/2012 | Nakanishi et al. |
| 9,195,577 B2 | 11/2015 | Saraswat et al. |
| 10,539,988 B2 | 1/2020 | Izumi |
| 2010/0231286 A1* | 9/2010 | Kuusilinna ............ G01K 7/425 327/512 |
| 2012/0042204 A1 | 2/2012 | Smith et al. |

(Continued)

FOREIGN PATENT DOCUMENTS

| JP | 2008-269379 A | 11/2008 |
| JP | 2014-153232 A | 8/2014 |

(Continued)

OTHER PUBLICATIONS

International Search Report dated Mar. 9, 2021 in PCT/JP2020/046533, filed Dec. 14, 2020, 3 pages.

*Primary Examiner* — William E. Baughman
(74) *Attorney, Agent, or Firm* — Oblon, McClelland, Maier & Neustadt, L.L.P.

(57) ABSTRACT

According to one embodiment, a memory device includes a first nonvolatile memory die, a second nonvolatile memory die, a controller, and a first temperature sensor and a second temperature sensor incorporated respectively in the first nonvolatile memory die and the second nonvolatile memory die. The controller reads temperatures measured by the first and second temperature sensors, from the first and second nonvolatile memory dies. When at least one of the temperatures read from the first and second nonvolatile memory dies is equal to or higher than a threshold temperature, the controller reduces a frequency of issue of commands to the first and second nonvolatile memory dies or a seed of access to the first and second nonvolatile memory dies.

12 Claims, 19 Drawing Sheets

(56) References Cited

U.S. PATENT DOCUMENTS

| | | | |
|---|---|---|---|
| 2014/0101371 A1* | 4/2014 | Nguyen | G06F 1/206 |
| | | | 711/103 |
| 2015/0373876 A1 | 12/2015 | Berke | |
| 2016/0266794 A1 | 9/2016 | Ishibashi | |
| 2018/0156645 A1* | 6/2018 | Geboers | G06F 11/3476 |
| 2019/0018611 A1* | 1/2019 | Kim | G06F 3/0625 |
| 2019/0043559 A1* | 2/2019 | McVay | G06F 3/0634 |
| 2019/0050153 A1* | 2/2019 | Yang | G06F 3/0679 |
| 2019/0094927 A1 | 3/2019 | Kuwano et al. | |
| 2019/0204885 A1 | 7/2019 | Ahuja et al. | |
| 2020/0401326 A1 | 12/2020 | Fujimoto et al. | |

FOREIGN PATENT DOCUMENTS

| | | |
|---|---|---|
| JP | 2014-531698 A | 11/2014 |
| JP | 2016-167167 A | 9/2016 |
| JP | 2019-46321 A | 3/2019 |
| JP | 2019-57194 A | 4/2019 |
| JP | 2020-161098 A | 10/2020 |
| WO | WO 2008/093606 A1 | 8/2008 |

\* cited by examiner

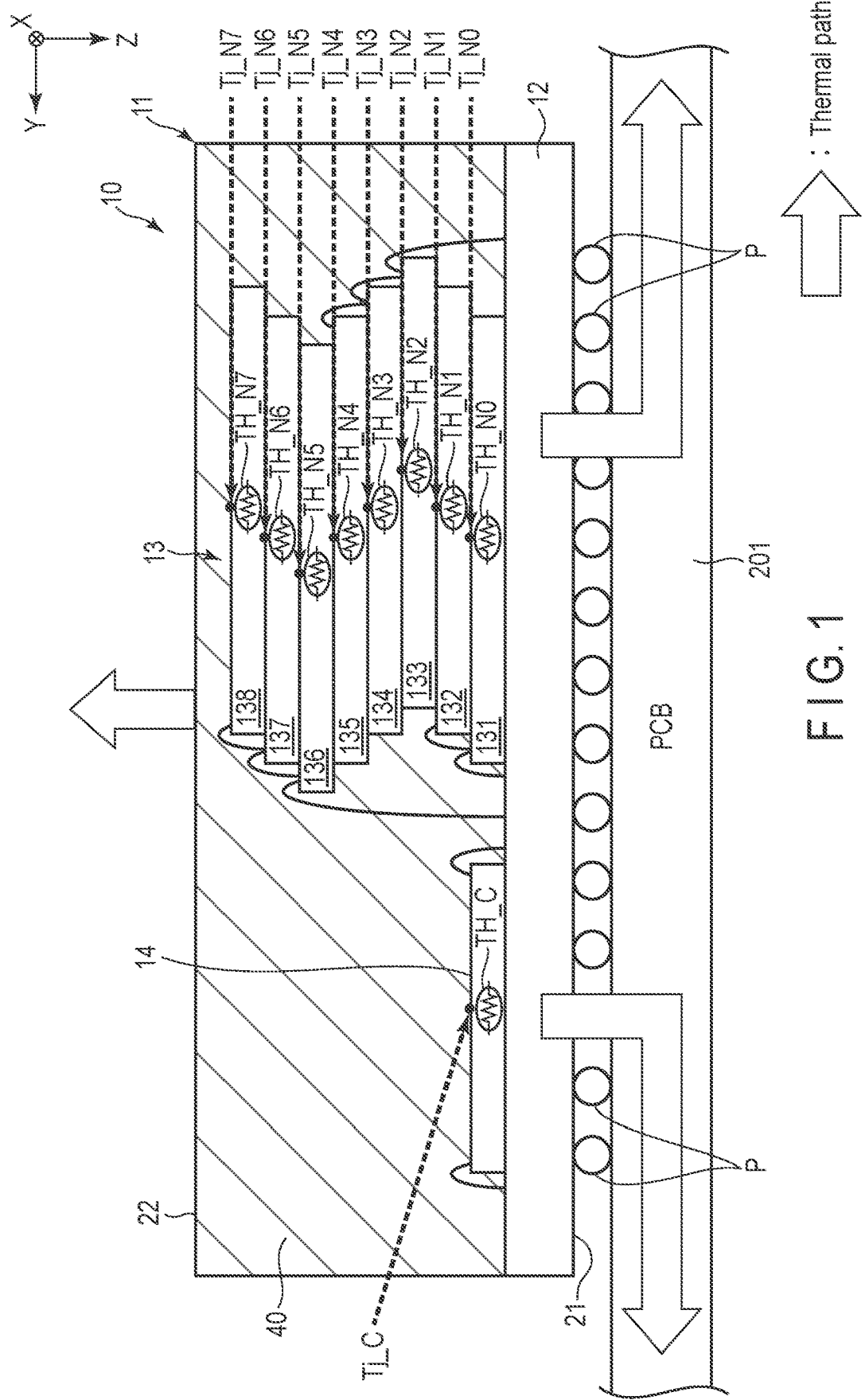
F I G. 1

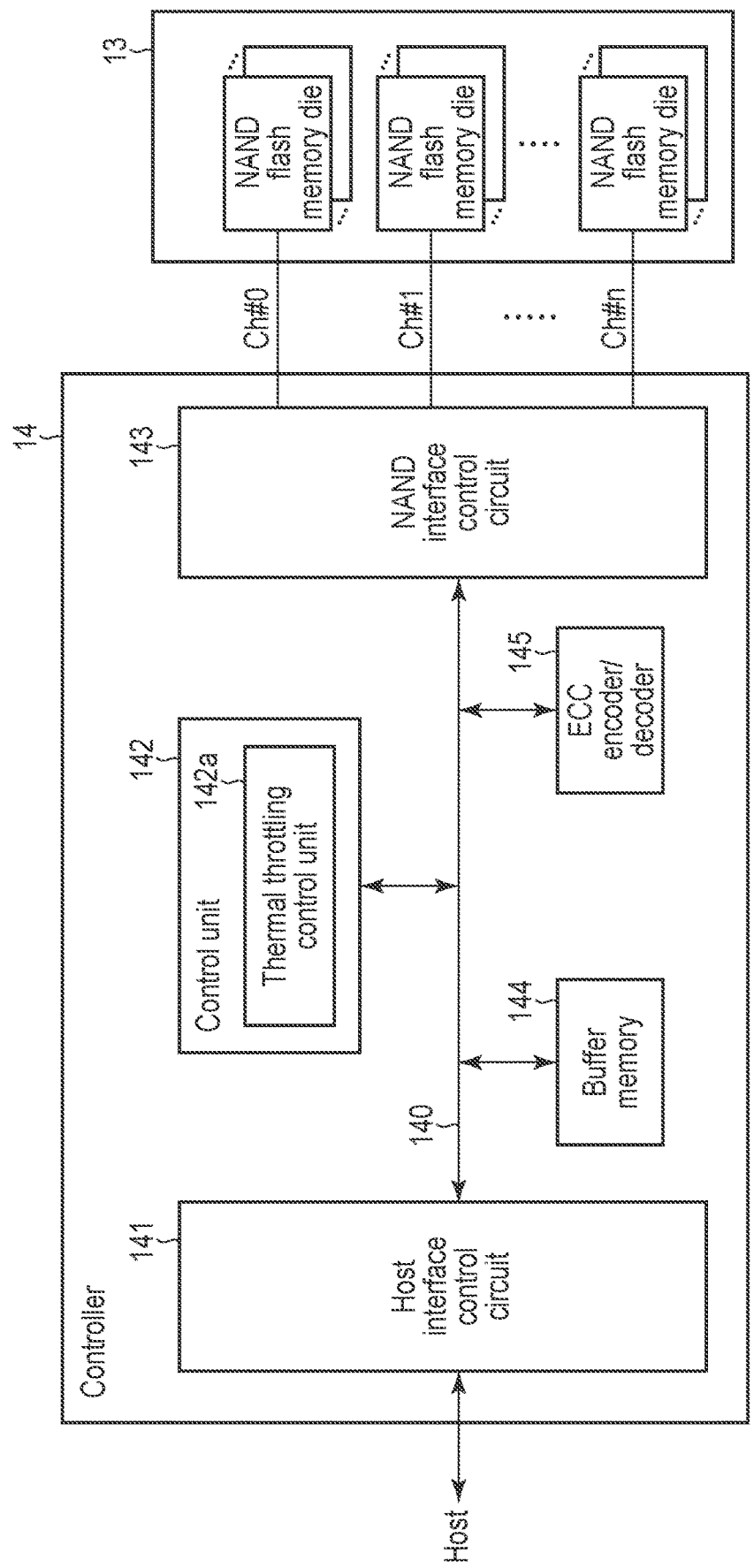
F I G. 2

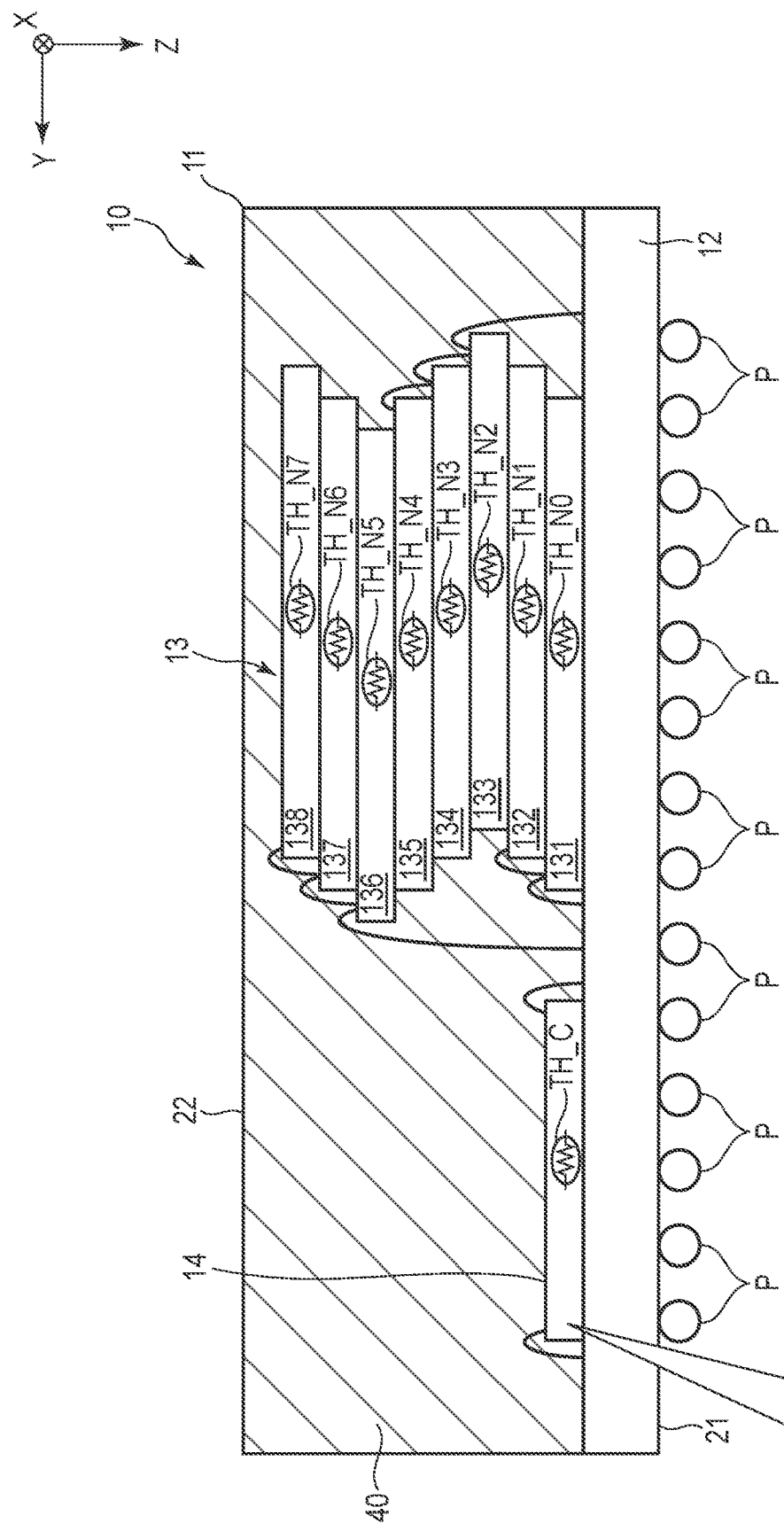
F I G. 8

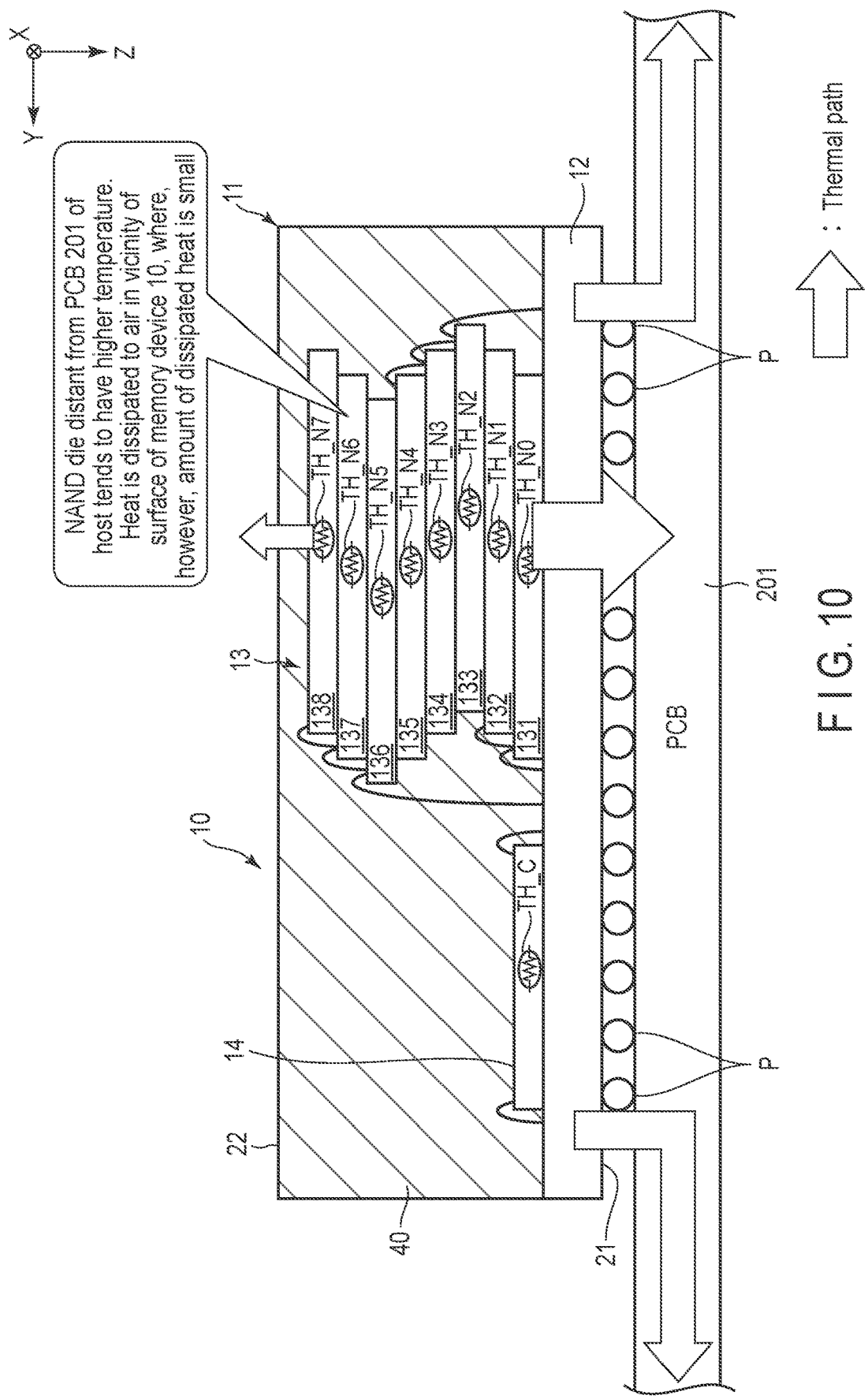
F I G. 10

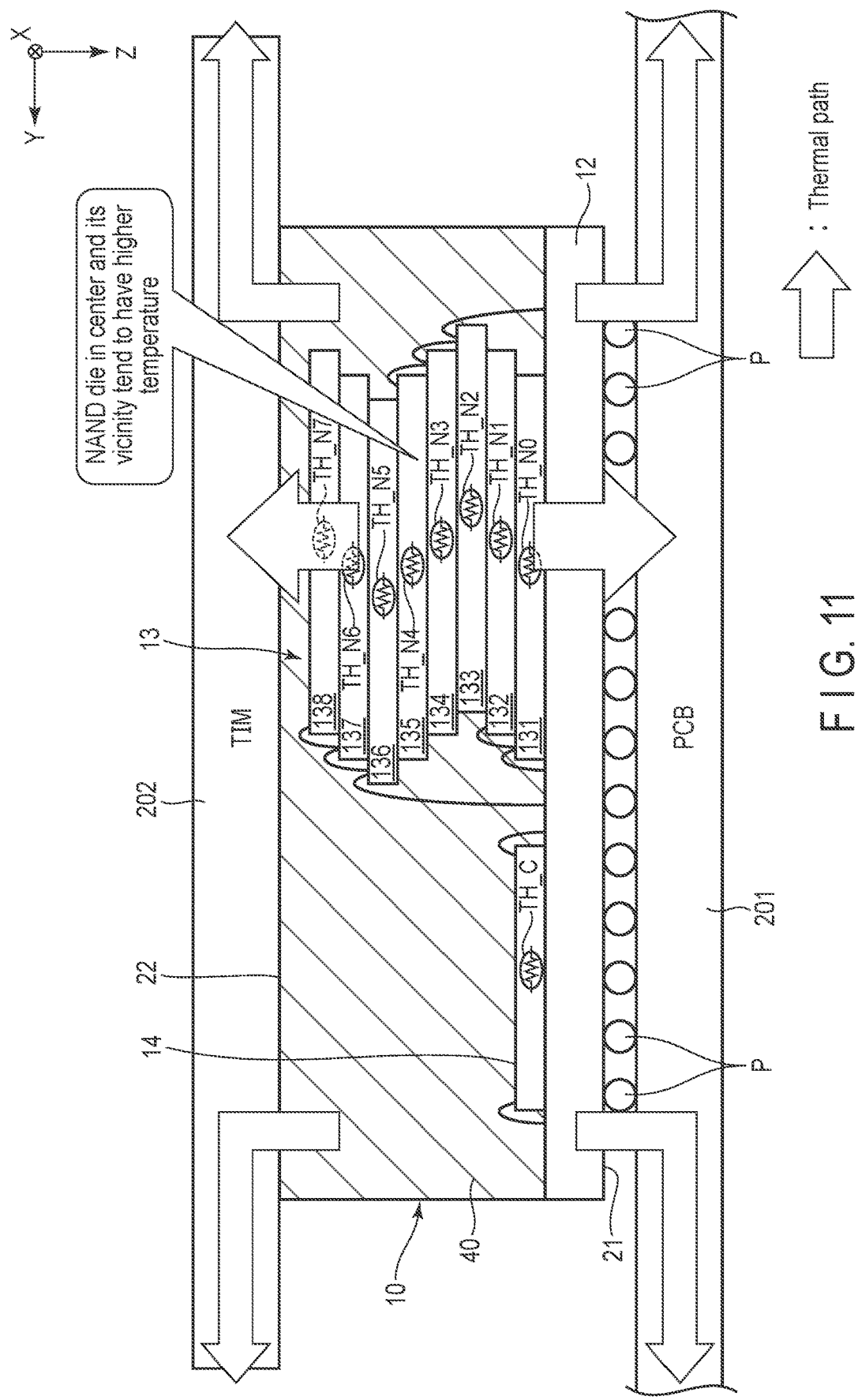
F I G. 11

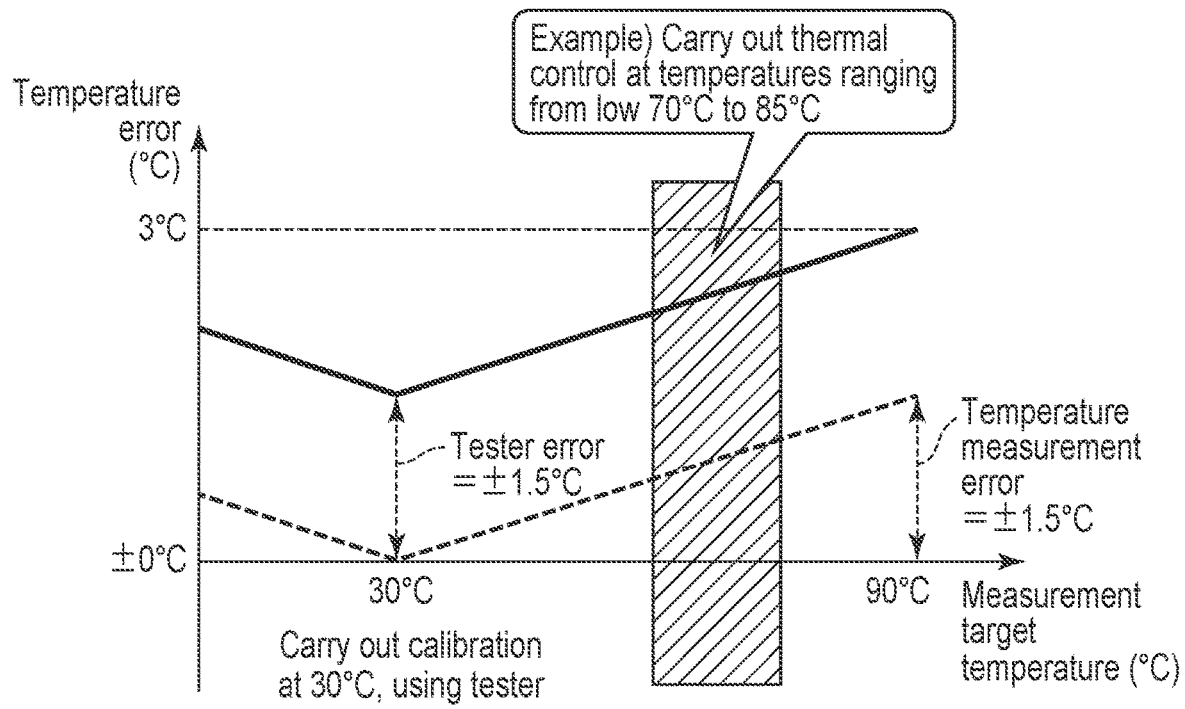
F I G. 14
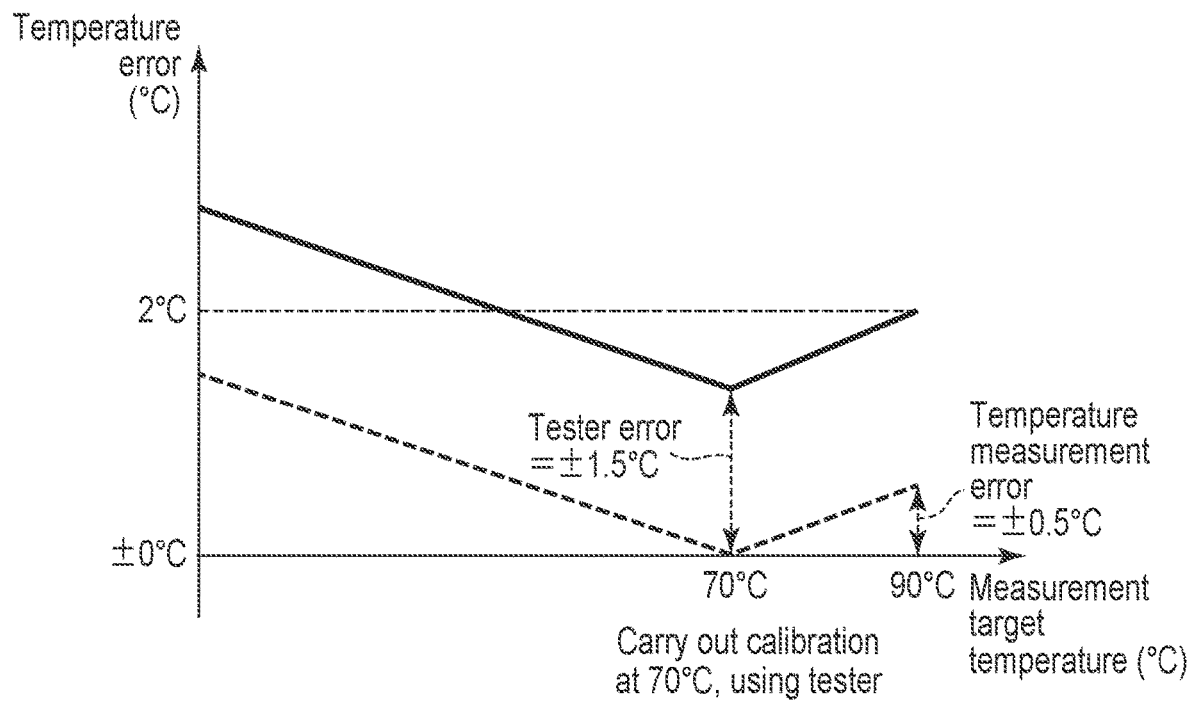
F I G. 15

TEMPERATURE SENSOR MANAGEMENT IN NONVOLATILE DIE-STACKED MEMORY

CROSS-REFERENCE TO RELATED APPLICATIONS

This application is a Continuation Application of PCT Application No. PCT/JP2020/046533, filed Dec. 14, 2020 and based upon and claiming the benefit of priority from Japanese Patent Application No. 2020-078368, filed Apr. 27, 2020, the entire contents of all of which are incorporated herein by reference.

FIELD

Embodiments described herein relate generally to a memory device that includes a nonvolatile memory and a controller, a memory device controlling method, and a memory device manufacturing method.

BACKGROUND

A memory device that includes a controller and a plurality of nonvolatile memory dies has been developed in recent years.

In such memory device, it is necessary to realize a mechanism for preventing the temperature of a nonvolatile memory die from exceeding an upper limit of the operation guarantee temperature of the nonvolatile memory die without causing an unnecessary degradation of the access performance of the memory device.

BRIEF DESCRIPTION OF THE DRAWINGS

FIG. 1 is a block diagram illustrating a configuration example of a memory device according to an embodiment.

FIG. 2 is a block diagram illustrating a configuration example of a controller included in the memory device according to the embodiment.

FIG. 8 is a diagram for explaining thermal control according to a comparative example, the thermal control being executed using a temperature sensor of the controller.

FIG. 10 is a diagram for explaining respective temperature tendencies of the plurality of NAND flash memory dies in the memory device in a case where the memory device according to the embodiment is mounted on a printed circuit board of a host apparatus.

FIG. 11 is a diagram for explaining respective temperature tendencies of the plurality of NAND flash memory dies in the memory device in a case where the memory device according to the embodiment is mounted on the printed circuit board of the host apparatus and a heat conducting member is disposed on an upper surface of the memory device.

FIG. 14 is a diagram for explaining a calibration operation according to a comparative example, the calibration operation being carried out to calibrate a temperature sensor included in each NAND flash memory die in a wafer, using a tester, at a room temperature.

FIG. 15 is a diagram for explaining an example of a calibration operation according to the embodiment, the calibration operation being carried out to calibrate the temperature sensor included in each NAND flash memory die in the wafer, using the tester, at a temperature close to a temperature at which thermal control is started.

DETAILED DESCRIPTION

Figure 3:
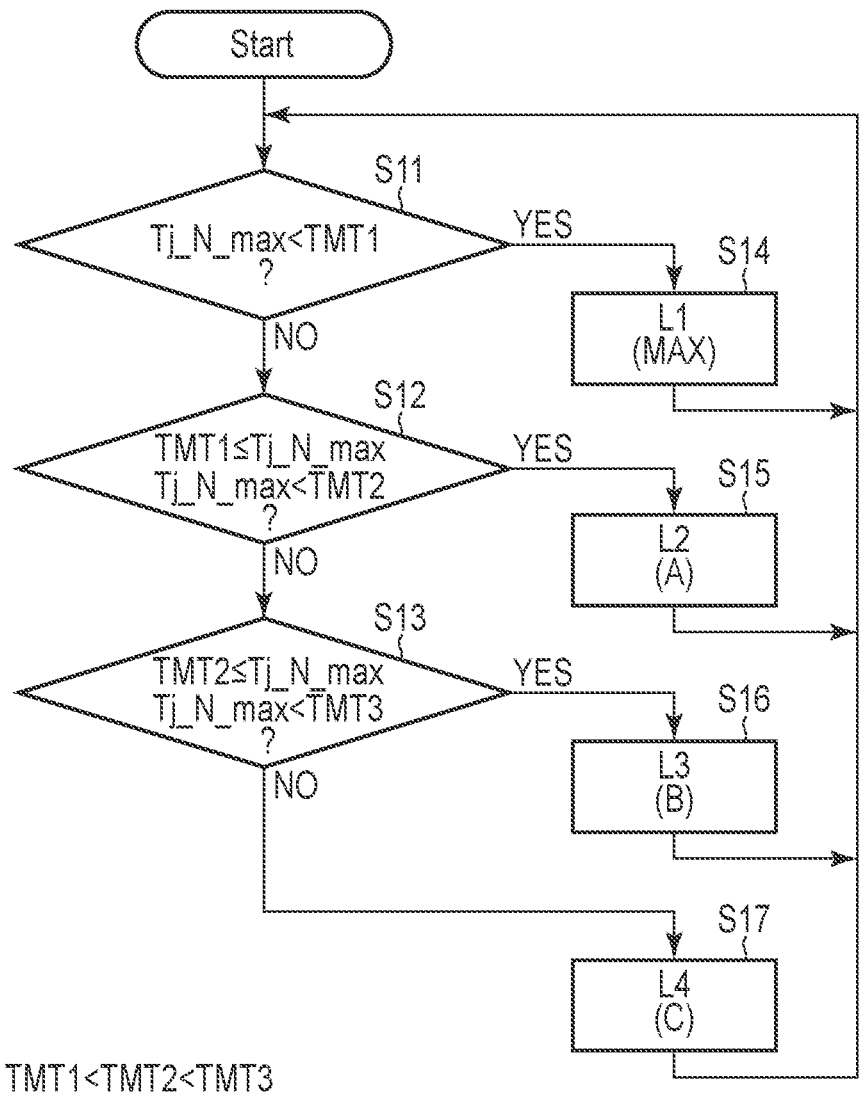
FIG. 3 is a flowchart illustrating an example of a procedure of a thermal control operation executed by the controller of FIG. 2.

Hereinafter, embodiments will be described with reference to the drawings.

In general, according to one embodiment, a memory device comprises: a first nonvolatile memory die; a second nonvolatile memory die stacked above the first nonvolatile memory die; a third nonvolatile memory die; a controller configured to control the first, second, and third nonvolatile memory dies; a first temperature sensor, a second temperature sensor, and a third temperature sensor incorporated respectively in the first nonvolatile memory die, the second nonvolatile memory die, and the third nonvolatile memory die; a first surface; a second surface located opposite to the first surface; and a plurality of terminals exposed on the first surface. The first nonvolatile die is stacked above the third nonvolatile die. The third nonvolatile die is closer to the first surface than the first and second nonvolatile dies. The controller decides not to read a temperature measured by the third temperature sensor, or not to compare the temperature with a threshold temperature, by learning in advance temperature tendencies of the first, second, and third nonvolatile dies in a period in which access to the first, second, and third nonvolatile memory dies is in progress. The controller reads temperatures measured by the first and second temperature sensors, from the first and second nonvolatile memory dies. When at least one of temperatures read from the first and second nonvolatile memory dies is equal to or higher than the threshold temperature, the controller reduces a frequency of issue of commands to the first, second, and third nonvolatile memory dies or a speed of access to the first, second, and third nonvolatile memory dies.

FIG. 1 is a diagram illustrating a configuration example of a memory device 10 according to an embodiment. The memory device 10 is a device in which a controller and a plurality of stacked NAND flash memory dies are integrated in one package.

The memory device 10 can be connected to various information processing apparatuses each functioning as a host apparatus, such as a personal computer and a mobile device. The memory device 10 may be realized as a removable memory device that is attachable to a connector (not illustrated) mounted on a printed circuit board (PCB) 201 in the host apparatus, the connector being referred to also as a socket. Alternatively, the memory device 10 may be realized as a surface mount memory device that is mounted on the printed circuit board 201 in the host apparatus.

A package (body) 11 of the memory device 10 has a thickness along a Z-axis direction, and includes a first surface 21, which is a lower surface of the package 11, and a second surface 22, which is an upper surface of the package 11. The second surface 22 is a surface opposite to the first surface 21.

The memory device 10 includes a package PCB (printed circuit board) 12, a NAND flash memory 13, a controller 14, and a plurality of terminals P. The NAND flash memory 13 and the controller 14 are covered and sealed with, for example, a molding resin 40.

The NAND flash memory 13 and the controller 14 are mounted on a front surface of the package PCB 12. As shown in FIG. 1, a back surface of the package PCB 12 may be exposed to the outside, as the first surface 21. The plurality of terminals P are arranged on the first surface 21, where the terminals P are exposed. When the back surface of the package PCB 12 is exposed to the outside as the first surface 21, therefore, the plurality of terminals P are arranged on the back surface of the package PCB 12.

The plurality of terminals P include, for example, a plurality of power terminals, a plurality of ground terminals, and a plurality of signal terminals.

The second surface 22 is used as a marking surface or the like, and no terminal P is disposed on the second surface 22.

The NAND flash memory 13 includes a plurality of NAND flash memory dies (which are referred to also as NAND flash memory chips) stacked in a direction of heading from the first surface 21 toward the second surface 22. On the front surface of the package PCB 12, these NAND flash memory dies are stacked along a Z-axis direction.

The number of the NAND flash memory dies stacked is not limited to a specific number. FIG. 1 shows a case where eight NAND flash memory dies 131 to 138 are stacked. The NAND flash memory die 131 located in the lowermost layer is disposed on the front surface of the package PCB 12. The NAND flash memory die 132 is stacked on the NAND flash memory die 131. The NAND flash memory die 138 located in the uppermost layer is stacked on the NAND flash memory die 137. The NAND flash memory dies 131 to 138 are an example of nonvolatile memory dies.

The NAND flash memory dies 131 to 138 have temperature sensors TH_N0 to TH_N7 built therein, respectively. The temperature sensors TH_N0 to TH_N7 measure respective temperatures Tj_N0 to Tj_N7 (which are referred to also as junction temperatures) of the NAND flash memory dies 131 to 138.

The temperature sensors TH_N0 to TH_N7 each include, for example, a temperature detection circuit and an analog/digital converter.

The controller 14 is also mounted on the front surface of the package PCB 12. The controller 14 is an LSI configured to control the NAND flash memory dies 131 to 138. The controller 14, too, has a temperature sensor TH_C built therein.

The temperature sensor TH_C measures a temperature Tj_C (which is referred to also as a junction temperature) of the controller 14. Similar to each of the temperature sensors TH_N0 to TH_N7, the temperature sensor TH_C includes, for example, a temperature detection circuit and an analog/digital converter.

Each of the NAND flash memory dies 131 to 138 generates heat corresponding in amount to its power consumption while the NAND flash memory 13 (i.e., the NAND flash memory dies 131 to 138) is accessed by the controller 14.

Heat from each of the NAND flash memory dies 131 to 138 is dissipated mainly through heat conduction from the first surface 21 to the printed circuit board 201 of the host apparatus. Part of heat from each of the NAND flash memory dies 131 to 138 is dissipated through heat transfer from the second surface 22 to the air. The amount of heat dissipated through heat transfer to the air is, however, smaller than the amount of heat dissipated through heat conduction to the printed circuit board 201.

The temperature of each of the NAND flash memory dies 131 to 138 should not exceed an upper limit to of the operation guarantee temperature of the NAND flash memory die. The operation guarantee temperature is defined as a temperature range in which the safe operation of each NAND flash memory die is guaranteed.

To suppress heat generation by each of the NAND flash memory dies 131 to 138, the controller 14 has a function of reducing the frequency of issue of commands to the NAND flash memory dies 131 to 138 or the speed of access to the NAND flash memory dies 131 to 138. This function is referred to as thermal control (or thermal throttling).

An operation of reducing the frequency of issue of commands is an operation of reducing the frequency of issue of commands to each NAND flash memory die during in one period by curtailing the number of commands issued from the controller 14 to each NAND flash memory die in the one period.

An operation of reducing the speed of access is an operation of increasing a cycle of a control signal (e.g., a read enable signal, a write enable signal, and the like), which is transmitted from the controller 14 to each NAND flash memory die, thereby increasing a time required for read/write access.

The controller 14 executes thermal control so that none of the NAND flash memory dies 131 to 138 has its temperature exceeding the upper limit of the operation guarantee temperature.

A thermal control operation according to a comparative example will first be described.

By the thermal control operation according to the comparative example, Tj_N_max is estimated from the temperature Tj_C measured by the temperature sensor TH_C incorporated in the controller 14. Tj_N_max represents the highest temperature among temperatures Tj_N0 to Tj_N7.

Generally, Tj_C>Tj_N_max holds in many cases. It is difficult, however, to express a correlation between Tj_C and Tj_N_max in the form of a numerical formula.

In a case of estimating Tj_N_max from Tj_C, therefore, it is necessary to determine an estimate of Tj_N_max while taking account of a large margin. In many cases, therefore, the estimated value of Tj_N_max turns out to be larger than the actual value of Tj_N_max.

As a result, thermal control is started prematurely before Tj_N_max actually reaches a temperature at which the thermal control is to be started. This results in an unnecessary degradation of the access performance of the NAND flash memory 13.

Next, a thermal control operation according to this embodiment will then be described.

In this embodiment, the controller 14 does not estimate Tj_N_max from Tj_C. Instead, the controller 14 estimates Tj_N_max by using the temperatures Tj_N0 to Tj_N7 measured by the temperature sensors TH_N0 to TH_N7 incorporated respectively in the stacked NAND flash memory dies 131 to 138.

In this case, the controller 14 reads the temperatures Tj_N0 to Tj_N7 measured by the temperature sensors TH_N0 to TH_N7, from the NAND flash memory dies 131 to 138. The controller 14 then uses the highest temperature among the read temperatures Tj_N0 to Tj_N7, as Tj_N_max.

The controller 14 carries out thermal control when the highest temperature Tj_N_max among the temperatures Tj_N0 to Tj_N7 is equal to or higher than a threshold temperature.

In this case, compared with the thermal control operation according to the comparative example in which Tj_N_max is estimated from TH_C, the accuracy of Tj_N_max is improved. As a result, a point of time of starting thermal control is made later than a point of time of starting thermal control by the thermal control operation according to the comparative example. Hence a time during which the NAND flash memory dies 131 to 138 are allowed to operate with their maximum access performance can be made longer. In other words, the access performance can be enhanced to a level close to the limits of thermal design of the memory device 10.

In addition, this embodiment further adopts a configuration for reducing respective temperature measurement errors of the temperature sensors TH_N0 to TH_N7 incorporated in the NAND flash memory dies 131 to 138.

A configuration example of the controller 14 included in the memory device 10 will then be described. FIG. 2 is a block diagram illustrating a configuration example of the controller 14.

The controller 14 includes a host interface control circuit 141, a control unit 142, a NAND interface control circuit 143, a buffer memory 144, and an ECC encoder/decoder 145.

The host interface control circuit 141, the control unit 142, the NAND interface control circuit 143, the buffer memory 144, and the ECC encoder/decoder 145 are connected to a bus 140.

The host interface control circuit 141 is configured to execute communication with the host apparatus. The host interface control circuit 141 receives various requests from the host apparatus. The various requests include a write request and a read request.

The control unit 142 is configured to control the host interface control circuit 141, the NAND interface control circuit 143, the buffer memory 144, and the ECC encoder/decoder 145. The control unit 142 is realized by a processor, such as a CPU.

The control unit 142 executes a control program (firmware), thereby carrying out various processes including a write control process and a read control process. The write control process is a process of writing data to a NAND flash memory die that is a writing target, via the NAND interface control circuit 143. The read control process is a process of reading data from a NAND flash memory die that is a readout target, via the NAND interface control circuit 143.

The control unit 142 includes a thermal throttling control unit 142a. The thermal throttling control unit 142a reads temperatures respectively from the plurality of NAND flash memory dies 131 to 138 included in the NAND flash memory 13. Temperatures read from the NAND flash memory dies 131 to 138 are temperatures measured by the temperature sensors TH_N0 to TH_N7 incorporated in the NAND flash memory dies 131 to 138.

The thermal throttling control unit 142a transmits a read command designating a specific address for temperature acquisition, to each NAND flash memory die, thereby being able to read a temperature measured by the temperature sensor in the NAND flash memory die, from the NAND flash memory die. Hereinafter, a temperature measured by the temperature sensor will be referred to also as "sensor output" or "temperature output".

The thermal throttling control unit 142a uses the maximum temperature among a plurality of temperature outputs read from the plurality of NAND flash memory dies 131 to 138, as Tj_N_max.

The thermal throttling control unit 142a compares Tj_N_max with the threshold temperature, and when Tj_N_max is equal to or higher than the threshold temperature, executes thermal control to reduce the frequency of issue of commands to the NAND flash memory dies 131 to 138 included in the NAND flash memory 13 or the speed of access to the NAND flash memory dies 131 to 138. A case where one threshold temperature is used for thermal control has been described. A plurality of threshold temperatures different from each other, however, may be used for thermal control.

The NAND interface control circuit 143 is a memory control circuit configured to control, under control by the control unit 142, the plurality of NAND flash memory dies. The NAND interface control circuit 143 is connected to the plurality of NAND flash memory dies via a plurality of channels Ch (Ch #0 to Ch #n).

The buffer memory 144 functions as a write buffer that temporarily stores write data received from the host apparatus, and also as a read buffer that temporarily stores data read from a NAND flash memory die.

The ECC encoder/decoder 145 encodes user data to be written to a NAND flash memory die (ECC encoding), thereby adding an error correction code (ECC) to the user data as a redundant code. When user data is read from a NAND flash memory die, the ECC encoder/decoder 145 corrects an error of the read user data, using an ECC added to the user data (ECC decoding).

An example of a procedure of the thermal control operation according to this embodiment will then be described. FIG. 3 is a flowchart illustrating the procedure of the thermal control operation executed by the controller 14.

For example, when eight NAND flash memory dies 131 to 138 are stacked, as shown FIG. 1, the maximum value among temperature values Tj_N0 to Tj_N7 is used as Tj_N_max.

A case is assumed where four states L1 to L4 (internal states) are defined. The data transfer rates of each NAND flash memory die in the states L1 to L4 are different from each other. The data transfer rate represents, for example, a read access throughput or a write access throughput.

L1: The data transfer rate of each NAND flash memory die is set to a maximum data transfer rate MAX.

L2: The data transfer rate of each NAND flash memory die is set to a data transfer rate A. The data transfer rate A is lower than the maximum data transfer rate MAX but is higher than a data transfer rate B that will be described later.

L3: The data transfer rate of each NAND flash memory die is set to the data transfer rate B. The data transfer rate B is lower than the data transfer rate A, but is higher than a data transfer rate C that will be described later.

L4: The data transfer rate of each NAND flash memory die is set to the data transfer rate C. The data transfer rate C is lower than the data transfer rate B.

The controller 14 controls the data transfer rate of each NAND flash memory die, using Tj_N_max and three threshold temperatures (TMT1, TMT2, TMT3). The threshold temperatures TMT1, TMT2, and TMT3 have a relationship: TMT1<TMT2<TMT3.

First, the controller 14 compares Tj_N_max with the threshold temperature TMT1, and determines whether Tj_N_max is lower than the threshold temperature TMT1 (step S11). In a period during which Tj_N_max remains lower than the threshold temperature TMT1 (YES at step S11), the controller 14 controls access to each NAND flash memory die so that the internal state of each NAND flash memory die becomes the state L1 (step S14). In this case, the data transfer rate of each NAND flash memory die is set to the maximum data transfer rate MAX.

When Tj_N_max is equal to or higher than the threshold temperature TMT1 (NO at step S11), the controller 14 determines whether Tj_N_max is a temperature that is equal to or higher than the threshold temperature TMT1 and that is lower than the threshold temperature TMT2 (step S12).

In a period during which Tj_N_max remains equal to or higher than the threshold temperature TMT1 and lower than the threshold temperature TMT2 (YES at step S12), the controller 14 controls access to each NAND flash memory die so that the internal state of each NAND flash memory die becomes the state L2 (step S15). In this case, the data transfer rate of each NAND flash memory die is set to the data transfer rate A lower than the maximum data transfer rate MAX.

When Tj_N_max is equal to or higher than the threshold temperature TMT2 (NO at step S12), the controller 14 determines whether Tj_N_max is a temperature that is equal to or higher than the threshold temperature TMT2 and that is lower than the threshold temperature TMT3 (step S13).

In a period during which Tj_N_max remains equal to or higher than the threshold temperature TMT2 and lower than the threshold temperature TMT3 (YES at step S13), the controller 14 controls access to each NAND flash memory die so that the internal state of each NAND flash memory die becomes the state L3 (step S16). In this case, the data transfer rate of each NAND flash memory die is set to the data transfer rate B lower than the data transfer rate A.

When Tj_N_max is equal to or higher than the threshold temperature TMT3 (NO at step S13), the controller 14 controls access to each NAND flash memory die so that the internal state of each NAND flash memory die becomes the state L4 (step S17). In this case, the data transfer rate of each NAND flash memory die is set to the data transfer rate C lower than the data transfer rate B.

The case where three threshold temperatures are used has been described. The number of threshold temperatures used, however, may be two or less or four or more.

Figure 4:
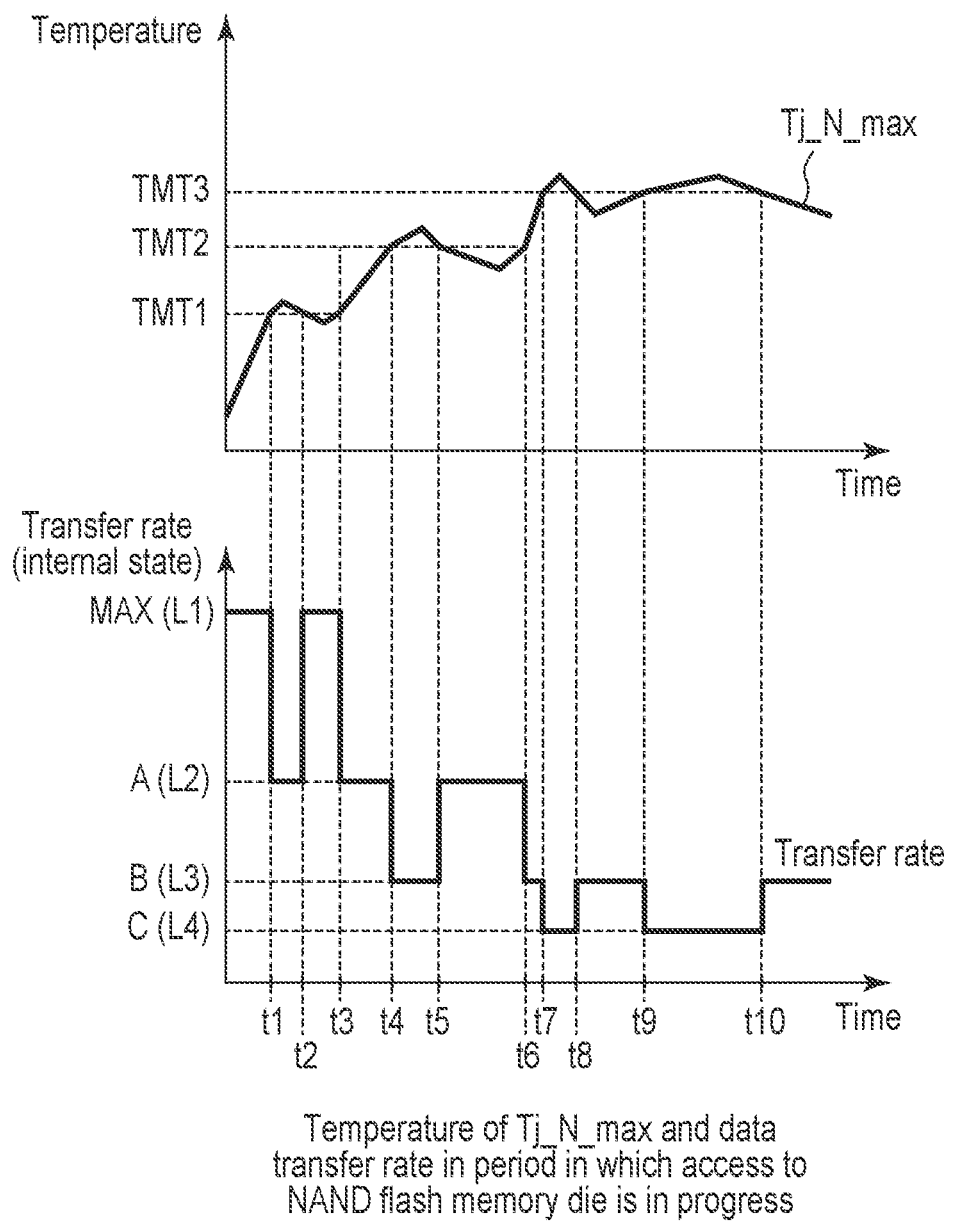
FIG. 4 is a diagram illustrating an example of a relationship between Tj_N_max and a data transfer rate in a period in which memory access is in progress.

FIG. 4 is a diagram illustrating an example of a relationship between Tj_N_max and the data transfer rate in a period in which memory access is in progress.

FIG. 4 shows a case where, for example, the data transfer rate A is ½ of the maximum data transfer rate MAX, the data transfer rate B is ¼ of the maximum data transfer rate MAX, and the data transfer rate C is ⅛ of the maximum data transfer rate MAX. Respective ratios of the data transfer rates A, B, and C to the maximum data transfer rate MAX are not limited to the ratios shown in this case, and any other ratios that satisfy a relationship of MAX>A>B>C can may be used. For example, the data transfer rate A may be ⅗ of the maximum data transfer rate MAX, the data transfer rate B may be ⅖ of the maximum data transfer rate MAX, and the data transfer rate C may be ⅕ of the maximum data transfer rate MAX.

In the period during which Tj_N_max remains lower than the threshold temperature TMT1, the data transfer rate is set to the maximum data transfer rate MAX. When Tj_N_max becomes equal to or higher than TMT1 (timing t1), the data transfer rate is reduced from the maximum data transfer rate MAX to the data transfer rate A.

When Tj_N_max drops below TMT1 as a result of the data transfer rate's being reduced to the transfer speed A (timing t2), the data transfer rate is then increased from the transfer speed A to the maximum data transfer rate MAX. In this state, when Tj_N_max becomes equal to or higher than TMT1 again (timing t3), the data transfer rate is reduced again from the maximum data transfer rate MAX to the data transfer rate A.

When Tj_N_max keeps rising to becomes equal to or higher than TMT2 (timing t4), the data transfer rate is reduced again from the data transfer rate A to the data transfer rate B. As the result, when Tj_N_max drops below TMT2 (timing t5), the data transfer rate is increased again from the data transfer rate B to the data transfer rate A. In this state, when Tj_N_max becomes equal to or higher than TMT2 again (timing t6), the data transfer rate is reduced again from the data transfer rate A to the data transfer rate B.

When Tj_N_max keeps rising to becomes equal to or higher than TMT3 (timing t7), the data transfer rate is reduced from the data transfer rate B to the data transfer rate C. As the result, Tj_N_max drops below TMT3 (timing t8), the data transfer rate is increased again from the data transfer rate C to the data transfer rate B. In this state, when Tj_N_max becomes equal to or higher than TMT3 again (timing t9), the data transfer rate is reduced from the data transfer rate B to the data transfer rate C. As the result, when Tj_N_max drops below TMT3 (timing t10), the data transfer rate is increased again from the data transfer rate C to the data transfer rate B.

Figure 5:
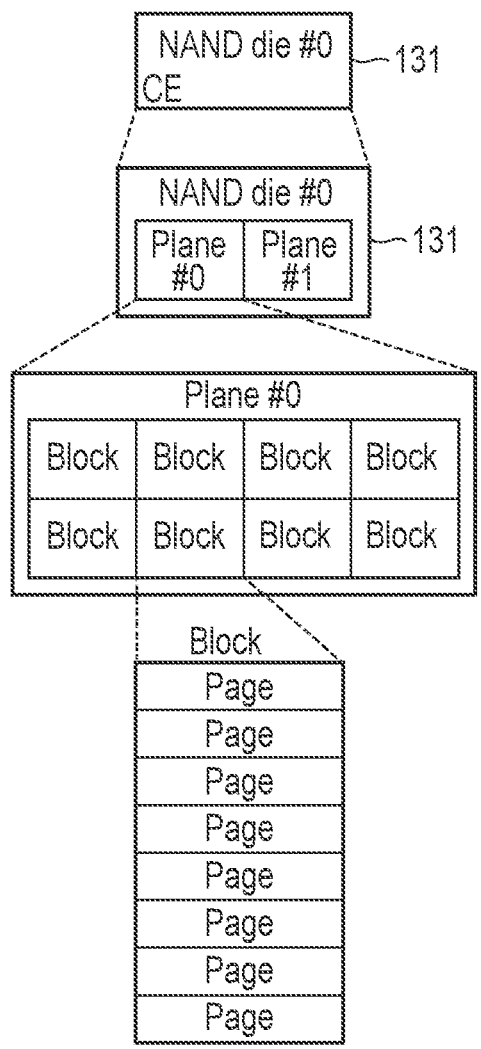
FIG. 5 is a diagram illustrating an example of a hierarchical structure of a cell array included in each of NAND flash memory dies.

A configuration example of each NAND flash memory die will then be described. FIG. 5 is a diagram illustrating an example of a hierarchical structure of a cell array included in each NAND flash memory die.

FIG. 5 shows a hierarchical structure of a cell array included in the NAND flash memory die 131 (which is referred to also as a NAND die #0).

The NAND die #0 has a chip enable terminal CE that receives a chip enable signal. When the chip enable signal is asserted, the NAND die #0 can be accessed.

The cell array of the NAND die #0 usually includes a plurality of planes. FIG. 5 illustrates a case where the cell array of the NAND die #0 includes two planes (plane #0, plane #1). Each of the two planes includes a plurality of blocks. Each block is a unit of a data erasing operation. Each block includes a plurality of pages. Each page is a unit of a data writing operation and a data reading operation. Each page includes a plurality of memory cells connected to the same word line.

Figure 6:
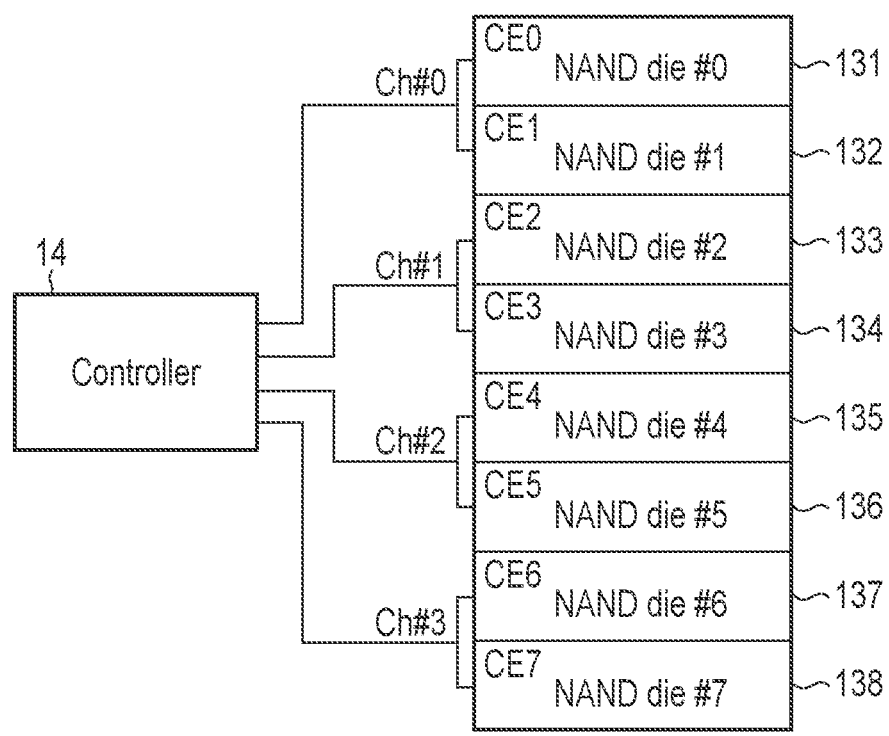
FIG. 6 is a diagram illustrating an example of connection between the controller and a plurality of NAND flash memory dies in the memory device according to the embodiment.

FIG. 6 is a diagram illustrating an example of connection between the controller 14 and the NAND flash memory dies 131 to 138.

FIG. 6 illustrates a case where the controller 14 is connected to the NAND flash memory dies 131 to 138 via four channels Ch #0 to Ch #3 and two NAND flash memory dies are connected to each channel.

The channels Ch #0 to Ch #3 each include, for example, an 8-bit wide IO bus and a plurality of control signal lines (a command latch enable signal line, an address latch enable signal line, a read enable signal line, a write enable signal line, and the like).

The NAND flash memory dies 131 and 132 are connected to the channel Ch #0. Likewise, the NAND flash memory dies 133 and 134 are connected to the channel Ch #1, the NAND flash memory dies 135 and 136 are connected to the channel Ch #2, and the NAND flash memory dies 137 and 138 are connected to the channel Ch #3.

In addition, chip enable signals CE0 to CE7 from the controller 14 are supplied respectively to the chip enable terminals of the NAND flash memory dies 131 to 138.

Figure 7:
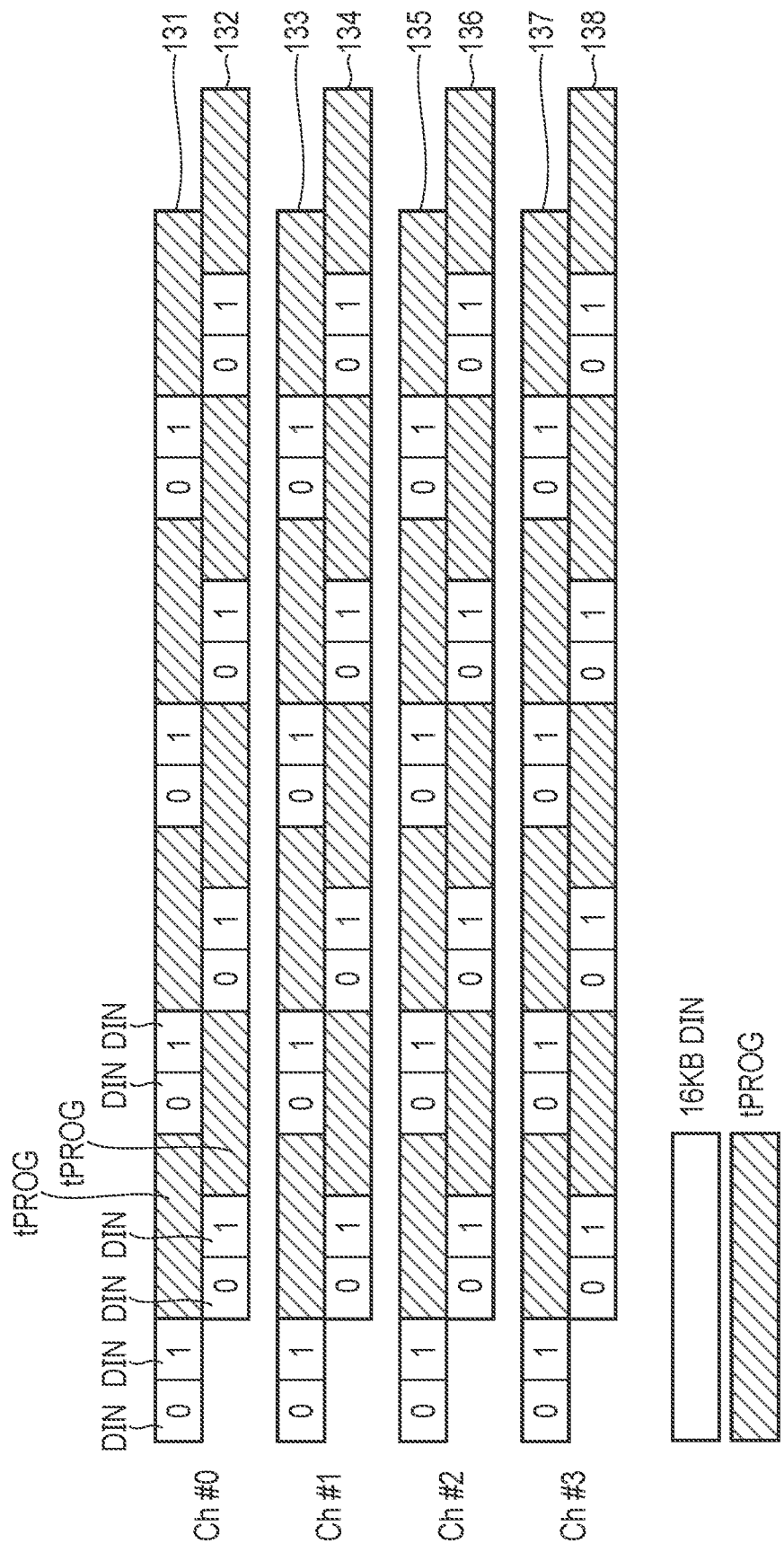
FIG. 7 is a diagram illustrating an example of an operation of accessing the plurality of NAND flash memory dies in parallel by interleaving.

FIG. 7 illustrates an example of an operation of accessing the NAND flash memory dies 131 to 138 in parallel by interleaving. In FIG. 7, an operation of performing write access to the NAND flash memory dies 131 to 138 in parallel by interleaving is illustrated.

In FIG. 7, DIN represents a data input cycle of transferring write data for one page (e.g., 16-KB data) to a NAND flash memory die. In a case where each NAND flash memory die has a multi-plane configuration including two planes #0 and #1, write data for two pages (e.g., 32-KB data) is transferred by two consecutive data transfer cycles DIN (0) and DIN (1).

In the data transfer cycle DIN (0), write data for one page to be written to a writing target block belonging to the plane #0 is transferred to a NAND flash memory die. In the data transfer cycle DIN (1), write data for one page to be written to a writing target block belonging to the plane #1, which is included in the same NAND flash memory die, is transferred to the NAND flash memory die.

tPROG represents a program time during which a page program operation is executed in each NAND flash memory die. In the program time tPROG, a page program operation corresponding to the plane #0 and a page program operation corresponding to the plane #1 are executed in parallel.

At each of the channels Ch #0 to Ch #3, in a period in which a certain NAND flash memory die is executing a program operation, write data is transferred to another NAND flash memory die (interleaving).

In this manner, by accessing the NAND flash memory dies 131 to 138 in parallel by the interleaving, all the NAND flash memory dies 131 to 138 can be operated in parallel.

Thermal control according to this embodiment will then be described in detail. Before detailed description of the thermal control according to this embodiment, thermal control according to a comparative example will first be described. FIG. 8 is a diagram for explaining the thermal control according to the comparative example, the thermal control being executed using the temperature sensor TH_C of the controller 14.

In the comparative example, the thermal control is carried out by estimating Tj_N_max from a temperature of the controller 14 measured by the temperature sensor TH_C of the controller 14.

However, because the controller 14 is at a location physically separated apart from the NAND flash memory dies 131 to 138, accurately estimating Tj_N_max from the temperature of the controller 14 is difficult. An error included in the temperature measured by the temperature sensor TH_C (temperature measurement error) also exists.

In the case of estimating Tj_N_max from the temperature of the controller 14, therefore, it is necessary to estimate the temperature of the controller 14 from a temperature output of the temperature sensor TH_C, with a large margin taken into consideration, and then estimate Tj_N_max from the estimated temperature of the controller 14. In the thermal control according to the comparative example, it is necessary to estimate the temperature of the controller 14, for example, with a margin of 4° C. in a measurement value of the temperature sensor TH_C being taken into consideration.

Figure 9:
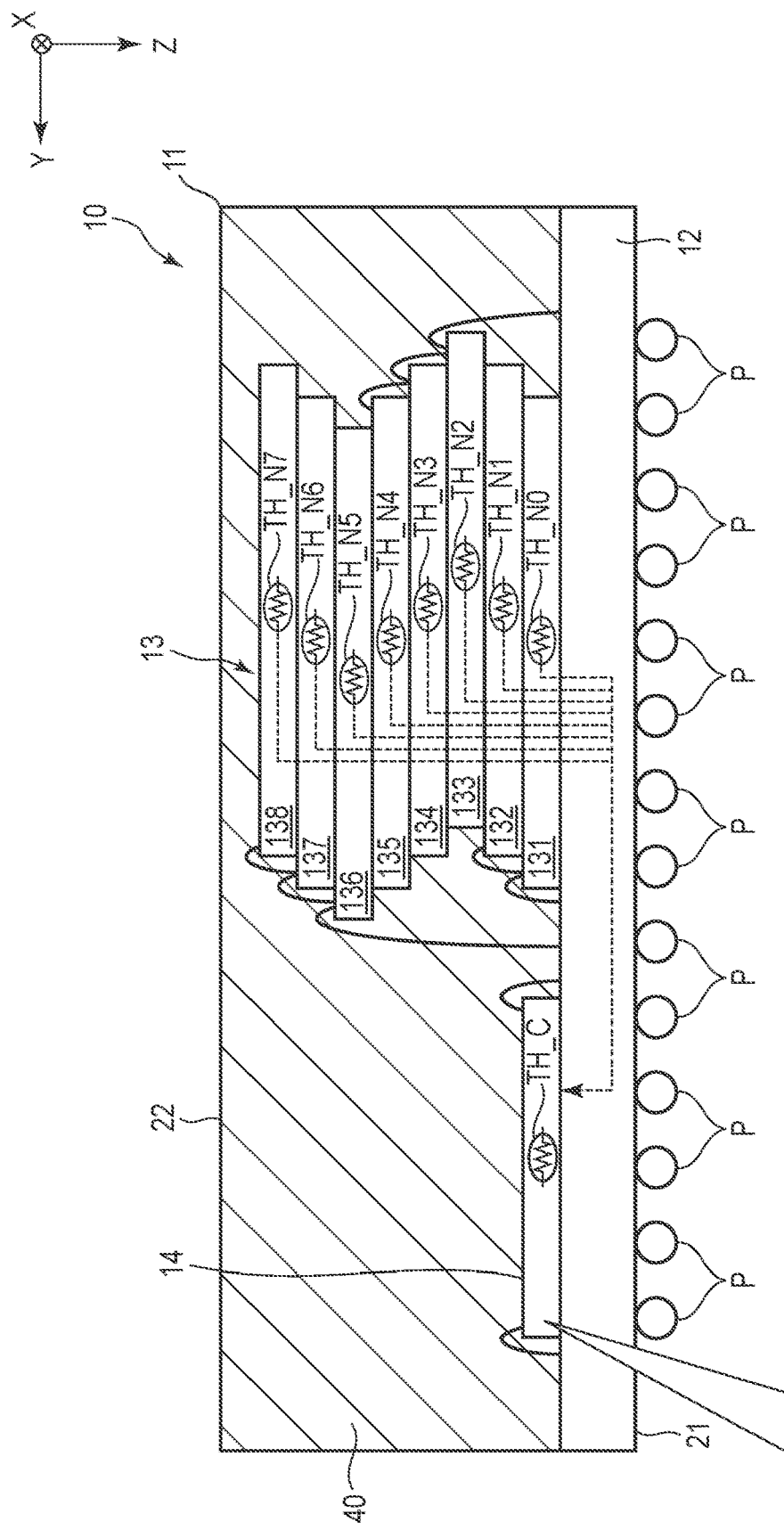
FIG. 9 is a diagram for explaining thermal control according to the embodiment, the thermal control being executed using a plurality of temperature sensors included respectively in the plurality of NAND flash memory dies.

FIG. 9 is a diagram for explaining the thermal control according to the embodiment, the thermal control being executed using the temperature sensors TH_N0 to TH_N7 included respectively in the NAND flash memory dies 131 to 138.

In the thermal control according to the embodiment, the controller 14 reads temperature outputs of the temperature sensors TH_N0 to TH_N7, from the NAND flash memory dies 131 to 138, and estimates Tj_N_max from the read temperature outputs of the temperature sensors TH_N0 to TH_N7 to execute the thermal control.

Respective temperatures of the stacked NAND flash memory dies 131 to 138 are not the same. In addition, none of the stacked NAND flash memory dies 131 to 138 is allowed to have its temperature exceeding the upper limit of the operation guarantee temperature of the NAND flash memory die.

The controller 14 thus carries out the thermal control by reading temperature outputs of all temperature sensors TH_N0 to TH_N7, from the NAND flash memory dies 131 to 138 and using the highest temperature among the read temperature outputs of the temperature sensors TH_N0 to TH_N7, as Tj_N_max.

Data indicating a temperature output of each of the temperature sensors TH_N0 to TH_N7 can be read from each NAND flash memory die, by transmitting a read command designating a specific address, to each NAND flash memory die.

The process of reading the temperature output from each of the temperature sensors TH_N0 to TH_N7, from each NAND flash memory die is executed by a method that does not affect the access performance of the memory device 10.

For example, the controller 14 may not constantly monitor measurement values of all temperature sensors TH_N0 to TH_N7 but read temperature outputs of all temperature sensors TH_N0 to TH_N7, from the NAND flash memory dies 131 to 138 at regular time intervals (e.g., 1-second intervals).

In this embodiment, because Tj_N_max is estimated from temperatures measured by the temperature sensors TH_N0 to TH_N7 incorporated in the NAND flash memory dies 131 to 138, only the temperature measurement errors of the temperature sensors TH_N0 to TH_N7 need to be considered as a margin at estimation of Tj_N_max.

Therefore, the margin of 4° C., which is needed in the thermal control according to the comparative example, is rendered unnecessary.

In addition, this embodiment adopts also a method by which the highest Tj_N is searched for quickly, using heat dissipation tendencies of the NAND flash memory dies 131 to 138 in the package 11.

This embodiment further adopts a method by which a temperature measurement error of a temperature sensor is reduced by changing a calibration temperature of the temperature sensor.

Next, heat dissipation tendencies of the NAND flash memory dies 131 to 138 in the package 11 will then be described. FIG. 10 is a diagram for explaining respective temperature tendencies of the stacked NAND flash memory dies 131 to 138 in the memory device 10 in a case where the memory device 10 is mounted on the printed circuit board 201 of the host apparatus.

Heat of the memory device 10 is dissipated mainly through heat conduction to the printed circuit board 201 of the host apparatus via the first surface 21. Heat dissipation efficiency is therefore high at a position close to the first surface 21. Heat of the memory device 10 is dissipated also through heat transfer to the air via the second surface 22. This heat transfer to the air, however, dissipates a small amount of heat.

For this reason, the memory device 10 including the stacked NAND flash memory dies 131 to 138 shows a tendency that the temperatures of one or more NAND flash memory dies close to the printed circuit board 201 are relatively low and the temperatures of one or more NAND flash memory dies located distant from the printed circuit board 201 are relatively high.

Given this fact, when the total number of the stacked NAND flash memory dies is N (N is an integer of 2 or more), it is not always necessary for the controller 14 to read the temperatures of all N NAND flash memory dies. In other words, by taking into consideration the heat dissipation tendencies of the NAND flash memory dies 131 to 138 in the package 11, the highest Tj_N can be searched for quickly.

In such a case, the controller 14 reads temperatures measured by N-1 or less temperature sensors incorporated in N-1 or less NAND flash memory dies that are temperature monitoring target dies selected from the NAND flash memory dies 131 to 138, from the N-1 or less NAND flash memory dies, i.e., the temperature monitoring target dies. The controller 14 then executes the thermal control when the highest temperature among the read temperatures is equal to or higher than the threshold temperature.

Among the stacked NAND flash memory dies 131 to 138, the NAND flash memory die 131 in the lowermost layer is located closer to the first surface 21 than to the second surface 22, and is therefore highly likely to have a temperature that is the lowest among the temperatures of the NAND flash memory dies 131 to 138. This leads to a conclusion that the NAND flash memory die 131 can be excluded from the temperature monitoring target dies. In addition to the NAND flash memory die 131, two or more NAND flash memory dies close to the first surface 21 may also be excluded from the temperature monitoring target dies.

Hence the N-1 or less NAND flash memory dies selected as the temperature monitoring target dies include one or more nonvolatile memory dies left by excluding at least the NAND flash memory die 131 from the NAND flash memory die 131 to 138.

FIG. 11 is a diagram for explaining respective temperature tendencies of the stacked NAND flash memory dies 131 to 138 in the memory device 10 in a case where the memory device 10 is mounted on the printed circuit board 201 of the host apparatus and a heat conducting member, such as a thermal interface material (TIM) 202, is disposed on an upper surface of the memory device (the second surface 22).

When the TIM 202 is attached to the second surface 22, as shown in FIG. 11, heat of the memory device 10 is dissipated also through heat conduction to the TIM 202 via the second surface 22. This improves the heat dissipation efficiency of one or more NAND flash memory dies located distant from the printed circuit board 201.

Therefore, in the structure of FIG. 11, the temperatures of one or more NAND flash memory dies near the center of the stacked NAND flash memory dies 131 to 138 tend to be the highest.

In this case, at least the NAND flash memory die 131 in the lowermost layer and the NAND flash memory die 138 in the uppermost layer may be excluded from the temperature monitoring target dies.

The N-1 or less NAND flash memory dies as the temperature monitoring target dies can be decided accurately, by learning in advance respective temperatures of the stacked NAND flash memory dies 131 to 138 in a period in which the NAND flash memory dies 131 to 138 are being accessed.

In other words, the controller 14 carries out in advance a process of learning which NAND flash memory die among the stacked NAND flash memory dies 131 to 138 has a high or low temperature. Having done the process, the controller 14 does not read temperatures of all NAND flash memory dies 131 to 138 but reads only the temperature outputs of temperature sensors in one or more specific NAND flash memory dies with higher temperatures, thereby carrying out the thermal control.

Figure 12:
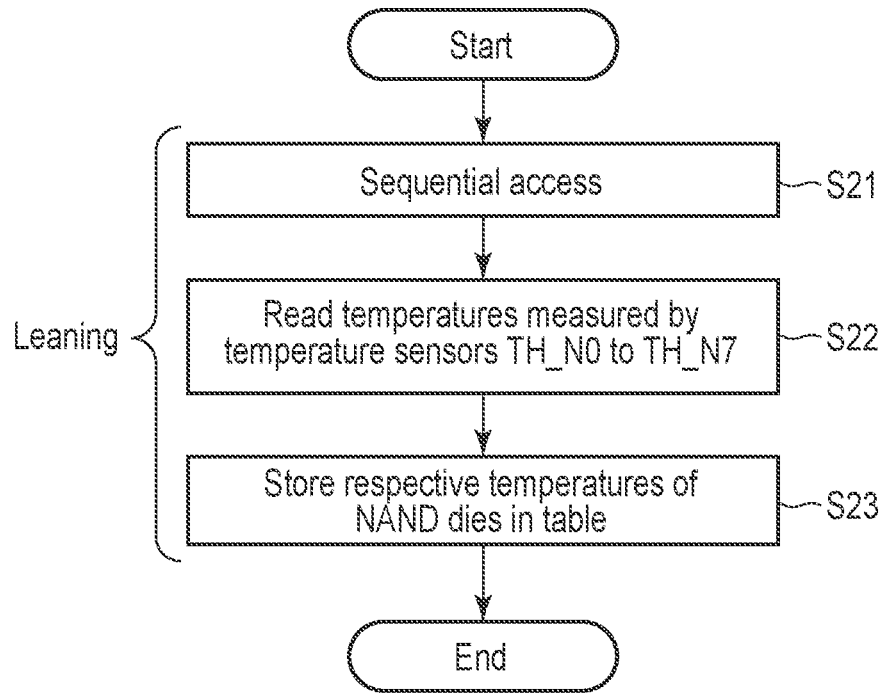
FIG. 12 is a flowchart illustrating a procedure of a learning process for checking in advance respective temperature tendencies of the plurality of NAND flash memory dies in a period in which memory access is in progress.

FIG. 12 is a flowchart illustrating a procedure of a learning process for checking in advance respective temperature tendencies of the NAND flash memory dies 131 to 138 in a period in which memory access is in progress.

In the learning process, the controller 14 performs sequential access to the NAND flash memory dies 131 to 138 (step S21), and during execution of sequential access, reads temperatures measured respectively by the temperature sensors TH_N0 to TH_N7 (respective measurement values of the temperature sensors TH_N0 to TH_N7), from the NAND flash memory dies 131 to 138 (step S22).

The controller 14 stores read respective measurement values of the temperature sensors TH_N0 to TH_N7, as learning results (step S23). The learning results may be stored in, for example, a table for firmware of the controller 14.

By carrying out such a learning process, NAND flash memory dies that tend to have higher temperatures can be specified as the temperature monitoring target NAND flash memory dies. Thus, the thermal control can be carried out by reading only the temperature outputs of N-1 or less temperature sensors in N-1 or less NAND flash memory dies that are selected by the learning process as the temperature monitoring target dies from the N NAND flash memory dies stacked in the package 11. Information indicating N-1 or less NAND flash memory dies selected as the temperature monitoring target dies may be stored in the table for the firmware of the controller 14, as information for specifying the NAND flash memory die as the temperature monitoring target die.

Examples of timing of carrying out the learning process in advance are as follows.

(1) The learning process is carried out in a period in which a developer of the memory device 10 is developing firmware of the controller 14.

(2) The learning process is carried out in a final test conducted before shipment of the memory device 10.

(3) At a set manufacturer that produces the host apparatus, the learning process is carried out during the development of the host apparatus.

Figure 13:
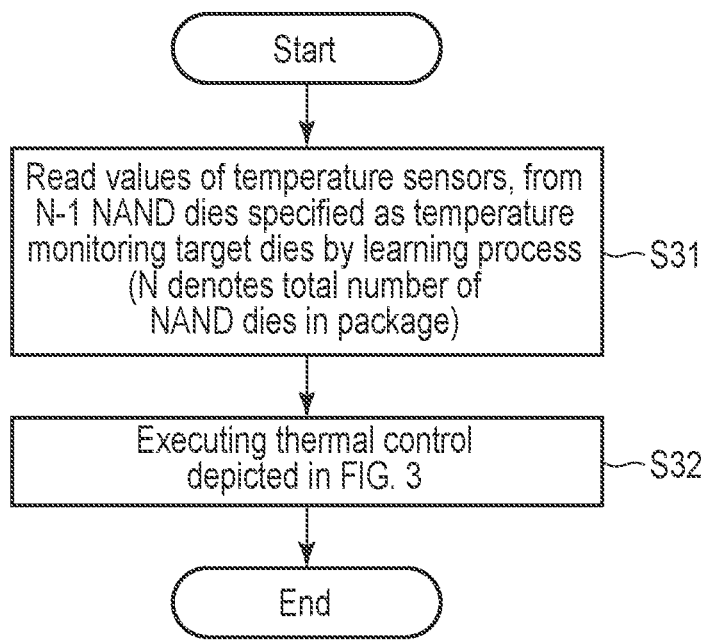
FIG. 13 is a flowchart illustrating a procedure of selecting specific one or more NAND flash memory dies from the plurality of NAND flash memory dies based on results of the learning process of FIG. 12, and executing thermal control using only temperature sensors included respectively in the selected specific one or more NAND flash memory dies.

FIG. 13 is a flowchart illustrating a procedure for executing the thermal control using only the temperature sensors included respectively in N-1 or less NAND flash memory dies specified as the temperature monitoring target dies by the learning process of FIG. 12.

After shipment of the memory device 10, the controller 14, at constant time intervals (e.g., 1-second intervals), reads only the temperature outputs of the temperature sensors included respectively in N-1 or less NAND flash memory dies specified by the learning process, from the specified N-1 or less NAND flash memory dies (step S31). The controller 14 then uses the maximum temperature among the read temperature outputs of N-1 or less temperature sensors, as Tj_N_max, thereby carrying out the thermal control of FIG. 3 (step S32).

It is possible that Tj_N_max is estimated by not taking a learning-based approach but carrying out a simulation of composite thermal resistance corresponding to the stacked NAND flash memory dies 131 to 138 in the package 11. When Tj_N_max is estimated by such a simulation, a thermal resistance model is calculated, using respective temperature outputs of the temperature sensors TH_N0 to TH_N7 and composite thermal resistance corresponding to the stacked NAND flash memory dies 131 to 138.

A method by which an error in a temperature measurement value of the temperature sensor is reduced by changing a temperature at which temperature sensor calibration is carried out will then be described. The following description will be made by citing specific numerical values for easier understanding. These numerical values, however, are shown as exemplary values, and this embodiment is not limited to an example described by using these numerical values.

The temperature sensor TH_N built in each NAND flash memory die is calibrated by a tester before dicing by which each NAND flash memory die is cut out from a wafer. TH_N represents any given temperature sensor to be calibrated that is included in the wafer.

The tester is a device that inspects a plurality of LSI chips (dies) formed on the wafer, using a prober. The wafer including the plurality of NAND flash memory dies is set on the prober, and calibration of the temperature sensor TH_N built in each NAND flash memory die in the wafer is executed.

FIG. 14 is a diagram for explaining a calibration operation according to a comparative example, the calibration operation being carried out to calibrate the temperature sensor TH_N included in each NAND flash memory die in the wafer, using the tester, at a room temperature.

The following two kinds of errors exist between the actual temperature Tj_N of the NAND flash memory die and a temperature measured by the temperature sensor TH_N.

Tester error: In the comparative example, the temperature sensor TH_N is calibrated by the tester at the room temperature (around 30° C.). An ambient temperature is set by the tester at accuracy of, for example, 30° C.±1.5° C. An error of ±1.5° C. thus arises as a tester error.

Temperature measurement error: A temperature measurement error is an error caused by the linearity of the temperature sensor TH_N. Even when the temperature sensor TH_N is calibrated at 30° C., the temperature measurement error of the temperature sensor TH_N increases as a difference between a measurement target temperature and 30° C. increases. For example, at 90° C., a temperature output of the temperature sensor TH_N includes a temperature measurement error of ±1.5° C.

At 90° C., therefore, the tester error±1.5° C. and the temperature measurement error±1.5° C. add up to create an error of ±3.0° C.

For the current NAND flash memory die, the thermal control is carried out in a temperature range (70° C. and above) higher than room temperature (e.g., 30° C.). This temperature range is, for example, from low 70° C. to 85° C.

According to this embodiment, therefore, in order to reduce the temperature measurement error of the temperature sensor TH_N, the temperature sensor TH_N is calibrated at a temperature higher than the room temperature. As a result, a difference between a temperature at which the temperature sensor TH_N is calibrated and a temperature at which the thermal control is carried out can be reduced. This allows a reduction in the temperature measurement error of the temperature sensor TH_N in the temperature range in which the thermal control is required.

FIG. 15 is a diagram for explaining an example of a calibration operation according to the embodiment, the calibration operation being carried out to calibrate the temperature sensor TH_N included in each NAND flash memory die in the wafer, using the tester, at a temperature close to a temperature at which the thermal control is started.

FIG. 15 illustrates a case where the temperature sensor TH_N is calibrated by the tester at 70° C.

An ambient temperature around the wafer is set by the tester, to a temperature close to 70° C. Subsequently, the temperature sensor TH_N is calibrated by the tester so that a temperature measured by the temperature sensor TH_N (which will hereinafter be referred to also as a temperature output of the temperature sensor TH_N) is 70° C. Calibration of the temperature sensor TH_N can be executed, for example, by adjusting the gradient (gain) and the intercept (offset) of a straight line representing the temperature characteristics of the temperature sensor TH_N. A correction value for adjusting the gradient and the intercept is finally written by the tester to the NAND flash memory die, non-volatilely.

The temperature characteristics of the temperature sensor TH_N can be approximated by the following linear function.

$$y=ax+b$$

In the equation, x denotes the ambient temperature (temperature input) of the temperature sensor TH_N, y denotes a temperature (temperature output) measured by the temperature sensor TH_N, a denotes the gradient of a straight line (approximate straight line) representing the temperature characteristics of the temperature sensor TH_N, and b denotes the intercept (y-intercept) of the approximate straight line.

As in the case of FIG. 14, a tester error of ±1.5° C. arises. However, because the temperature sensor TH_N is calibrated at 70° C., a difference between the temperature at which the temperature sensor TH_N is calibrated and the temperature at which the thermal control is carried out can be reduced. For example, at 90° C., an error included in a measurement value of the temperature sensor TH_N can be reduced to ±0.5° C.

At 90° C., therefore, the sum of the tester error±1.5° C. and the temperature measurement error±0.5° C. is reduced to ±2.0° C. As a result, the thermal control can be carried out more accurately, and therefore an unnecessary degradation of the access performance of the memory device 10 can be suppressed.

Figure 16:
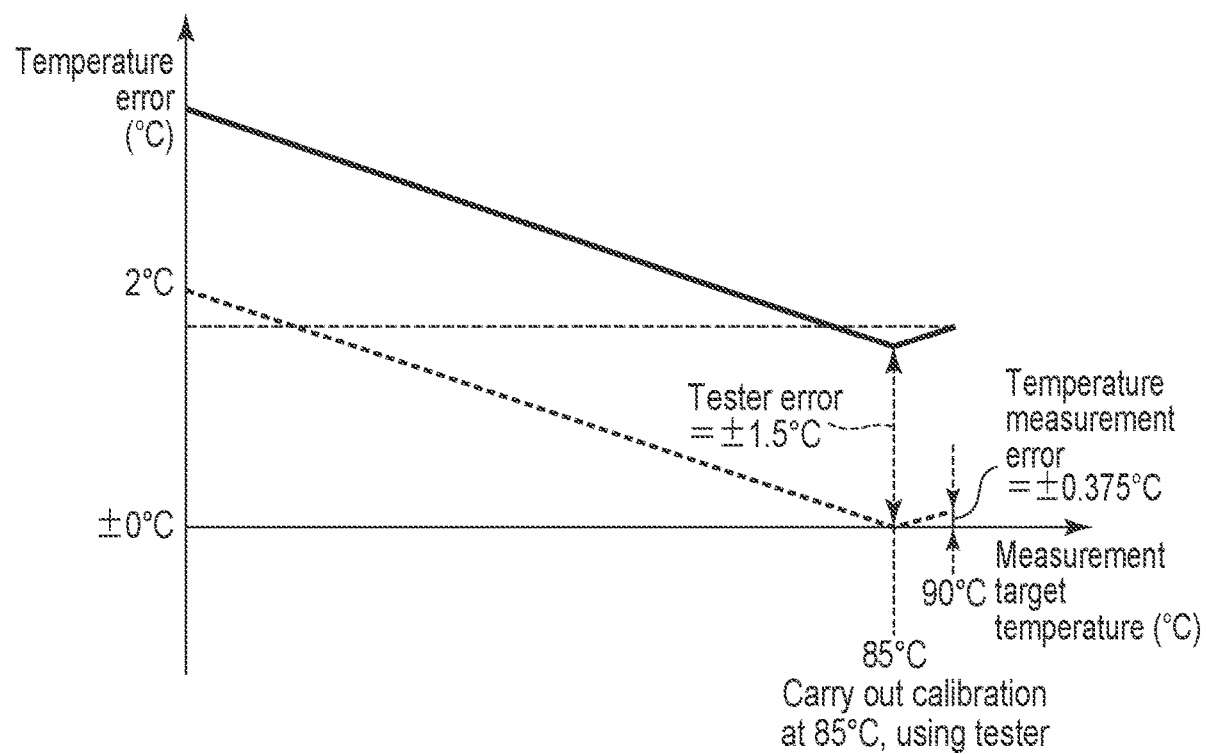
FIG. 16 is a diagram for explaining another example of the calibration operation according to the embodiment, the calibration operation in this example being carried out to calibrate the temperature sensor included in each NAND flash memory die in the wafer, using the tester, at an upper limit of the operation guarantee temperature of the NAND flash memory die.

FIG. 16 is a diagram for explaining another example of the calibration operation according to the embodiment, the calibration operation in this example being carried out to calibrate the temperature sensor TH_N included in each NAND flash memory die in the wafer, using the tester, at an upper limit to operation guarantee temperatures of the NAND flash memory die (e.g., 85° C.).

The ambient temperature around the wafer is set by the tester, to a temperature close to 85° C. Subsequently, the temperature sensor TH_N is calibrated by the tester so that a temperature measured by the temperature sensor TH_N (temperature output of the temperature sensor TH_N) is 85° C.

As in the case of FIG. 14, a tester error of ±1.5° C. arises. However, because the temperature sensor TH_N is calibrated at 85° C., a difference between the temperature at which the temperature sensor TH_N is calibrated and the temperature at which the thermal control is carried out can be reduced. For example, at 90° C., an error included in a measurement value of the temperature sensor TH_N can be reduced to ±0.375° C.

At 90° C., therefore, the sum of the tester error±1.5° C. and the temperature measurement error±0.375° C. is reduced to ±1.875° C. As a result, Tj_N_max can be measured more accurately. This prevents a case where the thermal control is started prematurely before Tj_N_max rises to the threshold temperature at which the thermal control is to be started.

In this embodiment, a correction value is non-volatilely stored in each of the NAND flash memory dies 131 to 138 in the memory device 10, the correction value being used for calibrating the temperature characteristics of the temperature sensor TH_N so that at a first temperature (70° C. or 85° C.) higher than the room temperature (30° C.), a temperature output of the temperature sensor TH_N is the first temperature (70° C. or 85° C.). In addition, the temperature sensor TH_N incorporated in each of the NAND flash memory dies 131 to 138 is configured to operate using the correction value non-volatilely stored in the corresponding NAND flash memory die. Hence a temperature measurement error of each temperature sensor TH_N can be reduced in a temperature range in which the thermal control is carried out.

The correction value can be obtained by calibrating the temperature sensor TH_N built in each nonvolatile memory die in the wafer at the first temperature, using the tester for inspecting each NAND flash memory die in the wafer. This correction value includes a correction value for the gradient of the temperature characteristics of the temperature sensor TH_N and a correction value for the intercept of the same.

Figure 17:
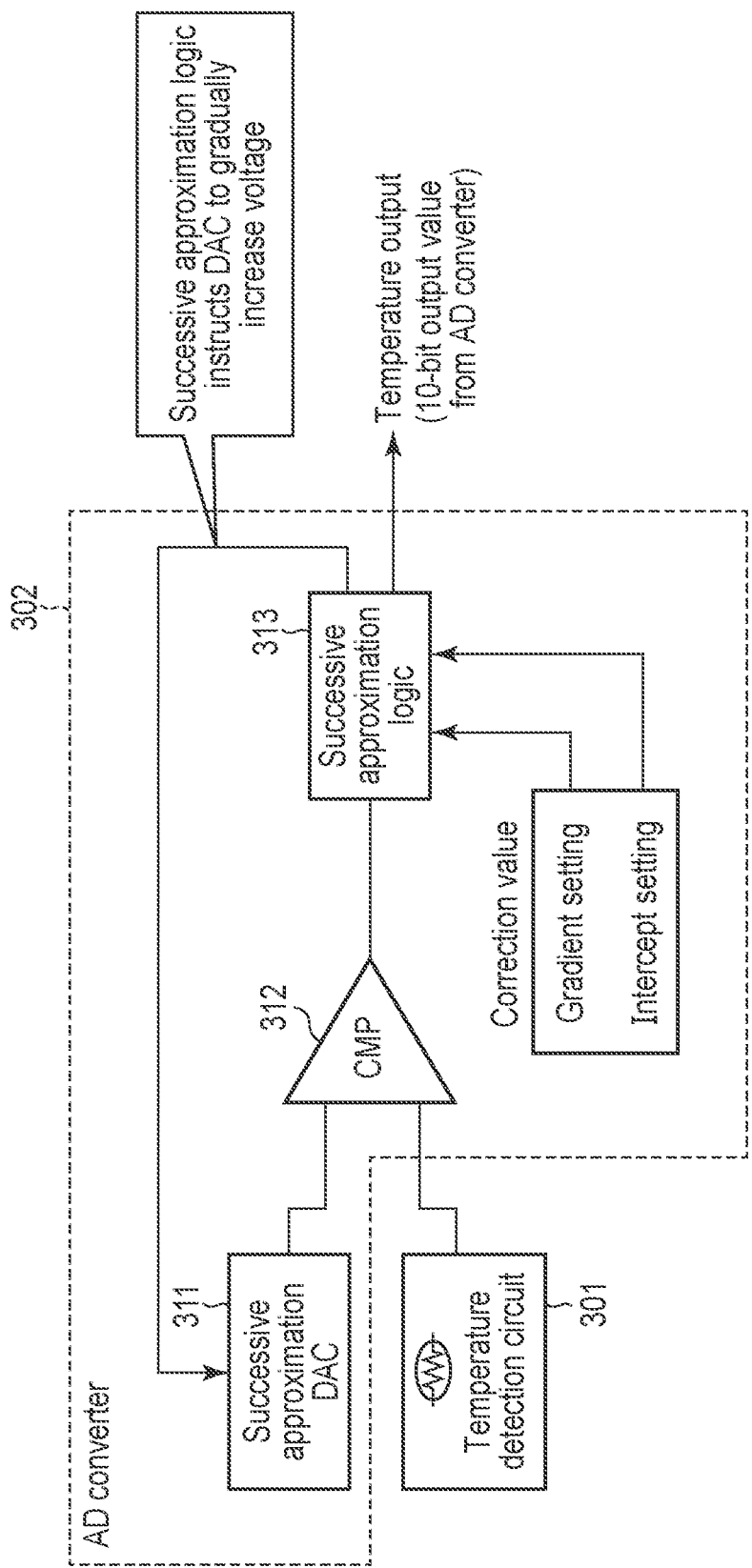
FIG. 17 is a block diagram illustrating a configuration example of the temperature sensor included in each NAND flash memory die.

Next, an example of a method for calibrating the temperature sensor TH_N will be described. FIG. 17 is a block diagram illustrating a configuration example of the temperature sensor TH_N included in each NAND flash memory die.

The temperature sensor TH_N includes a temperature detection circuit 301 and an analog/digital converter (AD converter) 302. The AD converter 302 is a circuit that converts an analog output value (output voltage) from the temperature detection circuit 301 into a digital value (e.g., 10 bits) indicating a temperature. The AD converter 302 includes, for example, a successive approximation digital-to-analog converter (DAC) 311, a comparator (CMP) 312, and a successive approximation logic 313.

The successive approximation logic 313 instructs the DAC 311 to gradually increase an output voltage. The CMP 312 compares an output voltage from the DAC 311 with an output voltage from the temperature detection circuit 301, and outputs a comparison result indicating a greater or lesser relationship between the output voltage from the DAC 311 and the output voltage from the temperature detection circuit 301.

In a period during which the output voltage from the DAC 311 remains lower than the output voltage from the temperature detection circuit 301, the successive approximation logic 313 instructs the DAC 311 to gradually increase its output voltage. The output voltage from the DAC 311 thus gradually increases. When the output voltage from the DAC 311 becomes equal to or higher than the output voltage from the temperature detection circuit 301, the comparison result output from the comparator 312 is reversed. The successive approximation logic 313 outputs a digital value (e.g., 10 bits) representing a temperature assigned to a voltage value that is outputted from the temperature detection circuit 301 when the comparison result output is reversed.

Calibration of the temperature sensor TH_N is carried out by setting correction values (gradient and intercept) on the successive approximation logic 313. The correction values (gradient and intercept) set on the successive approximation logic 313 are used by the AD converter 302 to convert an output voltage from the temperature detection circuit 301 into a temperature.

It should be noted that the temperature sensor TH_C built in the controller 14 is configured in the same manner as the temperature sensor TH_N included in the NAND flash memory die is.

Figure 18:
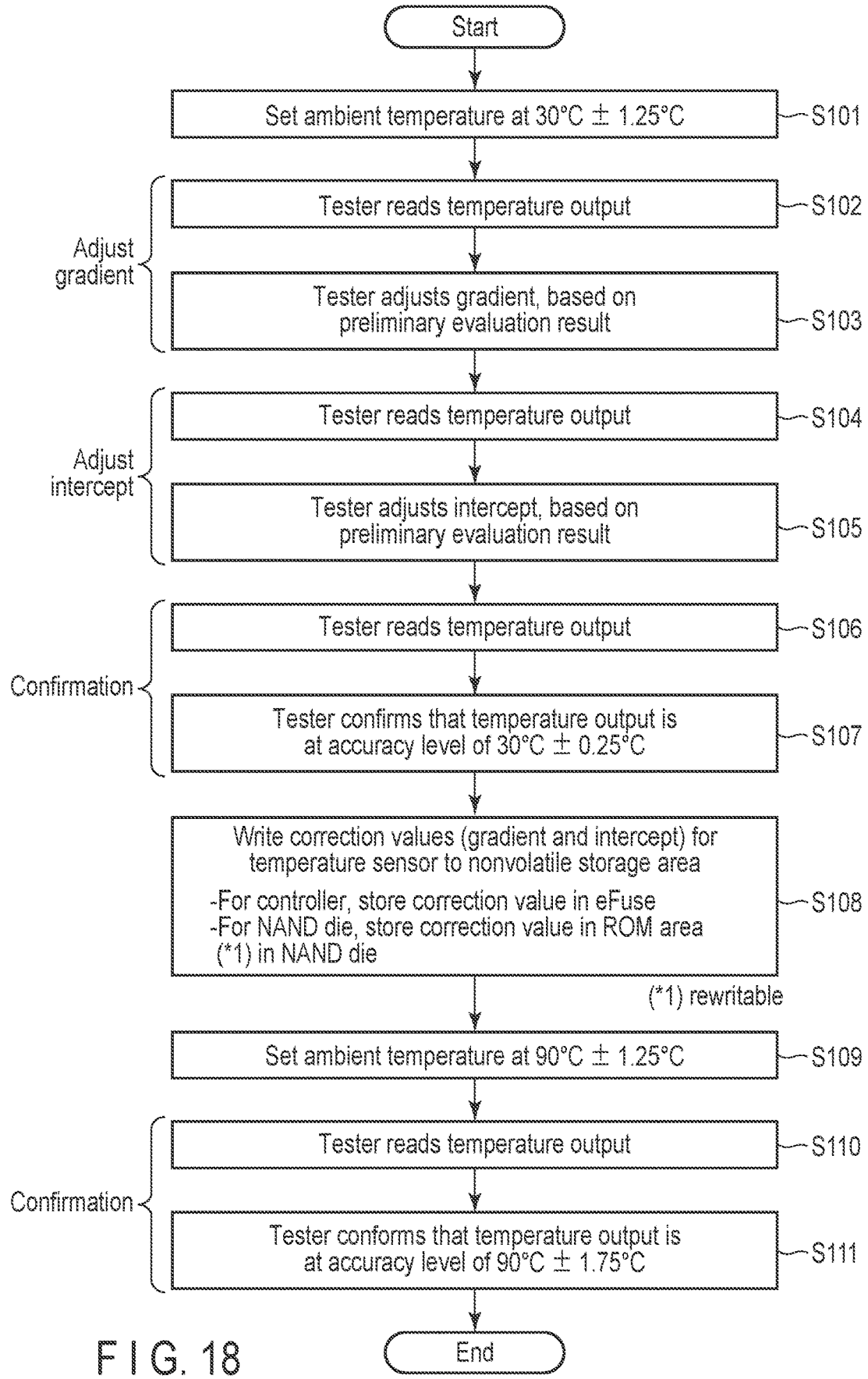
FIG. 18 is a flowchart illustrating an example of a procedure of a temperature sensor calibration process executed by the tester.

FIG. 18 is a flowchart illustrating an example of a procedure of calibration of the temperature sensor TH_N that is executed by the tester for inspecting the wafer.

The procedure of calibration will be described by showing a case where temperature sensor calibration is carried out at the room temperature (e.g., 30° C.).

The tester sets the ambient temperature around the wafer to be inspected, in which the plurality of NAND flash memory dies are formed, to 30° C. (e.g., 30° C.±1.25° C.) (step S101).

The tester transmits a read command designating a specific address, to a NAND flash memory die to be inspected, and reads a temperature measured by the temperature sensor TH_N included in the NAND flash memory die to be inspected (temperature output), from the NAND flash memory die to be inspected (step S102).

According to a tester program, the tester first determines a correction value (correction value for the gradient) to be set on the temperature sensor TH_N, from a preliminary evaluation result corresponding to the ambient temperature of 30° C. and the read temperature output, and writes the correction value for the gradient to a register, etc., for calibration of the temperature sensor TH_N, thereby adjusting the gradient of the temperature characteristics of the temperature sensor TH_N (step S103).

Figure 19:
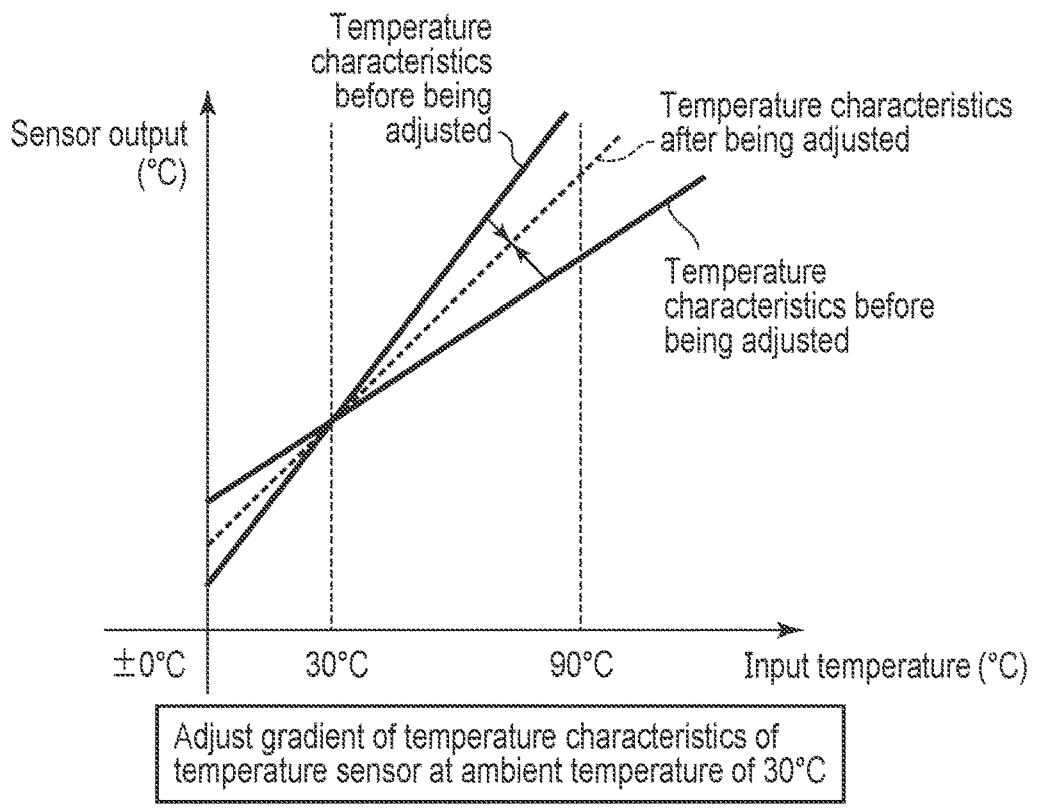
FIG. 19 is a diagram for explaining an example in which the gradient of a temperature characteristics line of the temperature sensor is adjusted by the tester.

In gradient adjustment at steps S102 and S103, the gradient of the temperature characteristics of the temperature sensor TH_N is adjusted to match a gradient indicated by the correction value, as shown in FIG. 19. In FIG. 19, straight lines shown as solid lines represent temperature characteristics of the temperature sensor TH_N before execution of gradient adjustment, and a straight line shown as a broken line represents a temperature characteristics of the temperature sensor TH_N after execution of gradient adjustment.

The tester transmits a read command designating the specific address, again to the NAND flash memory die to be inspected, and reads a temperature measured by the temperature sensor TH_N included in the NAND flash memory die to be inspected (temperature output), from the NAND flash memory die to be inspected (step S104).

The tester then determines a correction value (correction value for the intercept) to be set on the temperature sensor TH_N, from the preliminary evaluation result corresponding to the ambient temperature of 30° C. and the read temperature output, and writes the correction value for the intercept to the register, etc., for calibration of the temperature sensor TH_N, thereby adjusting the intercept (offset) of the temperature characteristics of the temperature sensor TH_N (step S105).

Figure 20:
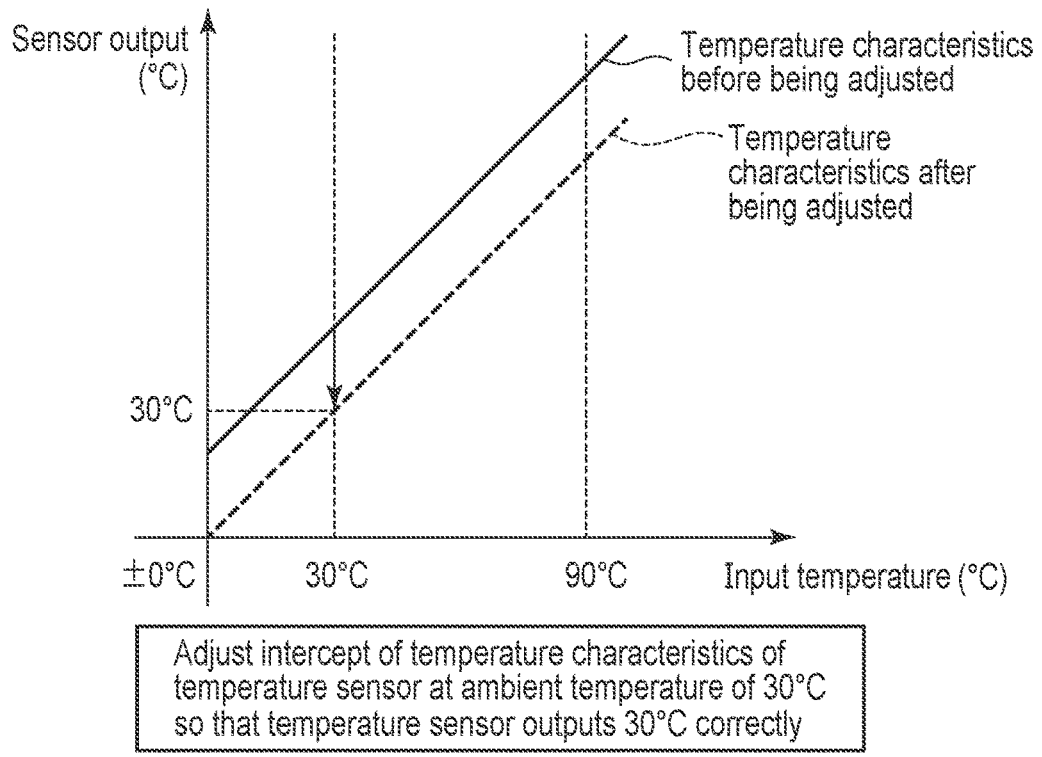
FIG. 20 is a diagram for explaining an example in which an intercept of the temperature characteristics line of the temperature sensor is adjusted by the tester.

In intercept adjustment at steps S104 and S105, the intercept of the temperature characteristics of the temperature sensor TH_N is adjusted to match an intercept indicated by the correction value, as shown in FIG. 20. In FIG. 20, a straight line shown as a solid line represents a temperature characteristics of the temperature sensor TH_N before execution of intercept adjustment, and a straight line shown as a broken line represents a temperature characteristics of the temperature sensor TH_N after execution of intercept adjustment. In this manner, the intercept is adjusted so that the temperature value of 30° C. is outputted correctly from the temperature sensor TH_N at the ambient temperature of 30° C.

Subsequently, the tester transmits a read command designating the specific address, again to the NAND flash memory die to be inspected, and reads a temperature measured by the temperature sensor TH_N included in the NAND flash memory die to be inspected (temperature output), from the NAND flash memory die to be inspected (step S106).

To determine whether calibration of the temperature sensor TH_N is successful, the tester confirms that the read temperature output is at an accuracy level of 30° C.±0.25° C. (step S107). When the read temperature output is at the accuracy level of 30° C.±0.25° C., it is determined that calibration of the temperature sensor TH_N is successful.

The sum of an error of 1.25° C. at step S101 and an error of 0.25° C. at step S107 corresponds to the above-mentioned tester error of 1.5° C.

Subsequently, the tester writes the correction values (gradient and intercept) to a nonvolatile storage area in the NAND flash memory die to be inspected (step S108). In the NAND flash memory die, the correction values (gradient and intercept) are written to a ROM area where data can be rewritten electrically, the ROM area being used to store control information different from user data. After the NAND flash memory die is packaged as the memory device 10, the temperature sensor TH_N in the NAND flash memory die operates using the correction values (gradient and intercept) stored in the ROM area.

When the temperature sensor TH_C of the controller 14 is calibrated, the correction values (gradient and intercept) are written to an electronic fuse (eFuse) that can be used as a nonvolatile storage area in the controller 14.

The tester sets the ambient temperature around the wafer to be inspected, to 90° C. (e.g., 90° C.±1.25° C.) (step S109).

The tester transmits a read command designating the specific address, again to the NAND flash memory die to be inspected, and reads a temperature measured by the temperature sensor TH_N included in the NAND flash memory die to be inspected (temperature output), from the NAND flash memory die to be inspected (step S110).

The tester confirms that the read temperature output is at an accuracy level of, for example, 90° C.±1.75° C. (step S111). At this time, if the read temperature output is out of the accuracy level of 90° C.±1.75° C., the tester marks the NAND flash memory die to be inspected, as a defective chip. An error of 1.75° C. is the sum of the error of 0.25° C. at step S107 and a temperature measurement error of 1.5° C. made at 90° C.

In this embodiment, gradient adjustment at steps S102 and S103 and intercept adjustment at steps S104 and S105 are executed in a condition where the ambient temperature is set to 70° C. (e.g., 70° C.±1.25° C.) or 85° C. (e.g., 85° C.±1.25° C.).

In this embodiment, it is confirmed at step S107 that a read temperature output is at an accuracy level of 70° C.±0.25° C. or that a read temperature output is at an accuracy level of 85° C.±0.25° C. Then, at step S108, correction values (gradient and intercept) are written to the nonvolatile storage area in the NAND flash memory die to be inspected. In the NAND flash memory die, the correction values (gradient and intercept) are written to the ROM area where data can be rewritten electrically. After the NAND flash memory die is packaged as the memory device 10, the temperature sensor TH_N in the NAND flash memory die can operate using the correction values (gradient and intercept) stored in the ROM area. Hence a temperature measurement error of each temperature sensor TH_N can be reduced in a temperature range in which the thermal control is carried out.

According to this embodiment, when calibration is carried out at 70° C., it is confirmed at step S111 that a read temperature output is at an accuracy level of, for example, 90° C.±0.75° C., and when calibration is carried out at 85° C., it is confirmed at step S111 that a read temperature output is at an accuracy level of, for example, 90° C.±0.625° C.

As described above, according to the calibration method of this embodiment, the temperature sensor, which is built in each of the stacked NAND flash memory dies 131 to 138 incorporated together with the controller 14 in the package 11 of the memory device 10, is calibrated before the NAND flash memory die 131 to 138 are packaged.

In this case, according to the calibration method of this embodiment, (1) the tester, which inspects each NAND flash memory die in the wafer, calibrates the temperature characteristics of the temperature sensor built in each NAND flash memory die in the wafer, at the first temperature (e.g., 70° C. or 85° C.) higher than the room temperature, and (2) the tester writes correction values for the temperature characteristics of the temperature sensor, the correction values being obtained by the calibration, to each NAND flash memory die in the wafer.

In this manner, the NAND flash memory dies having their temperature sensors calibrated at 70° C. or 85° C. are packaged as the memory device 10. As a result, in the memory device 10, the controller 14 is able to read a measurement temperature with less error from the temperature sensor of each of the stacked NAND flash memory dies 131 to 138 in a temperature range in which the thermal control is carried out.

Figure 21:
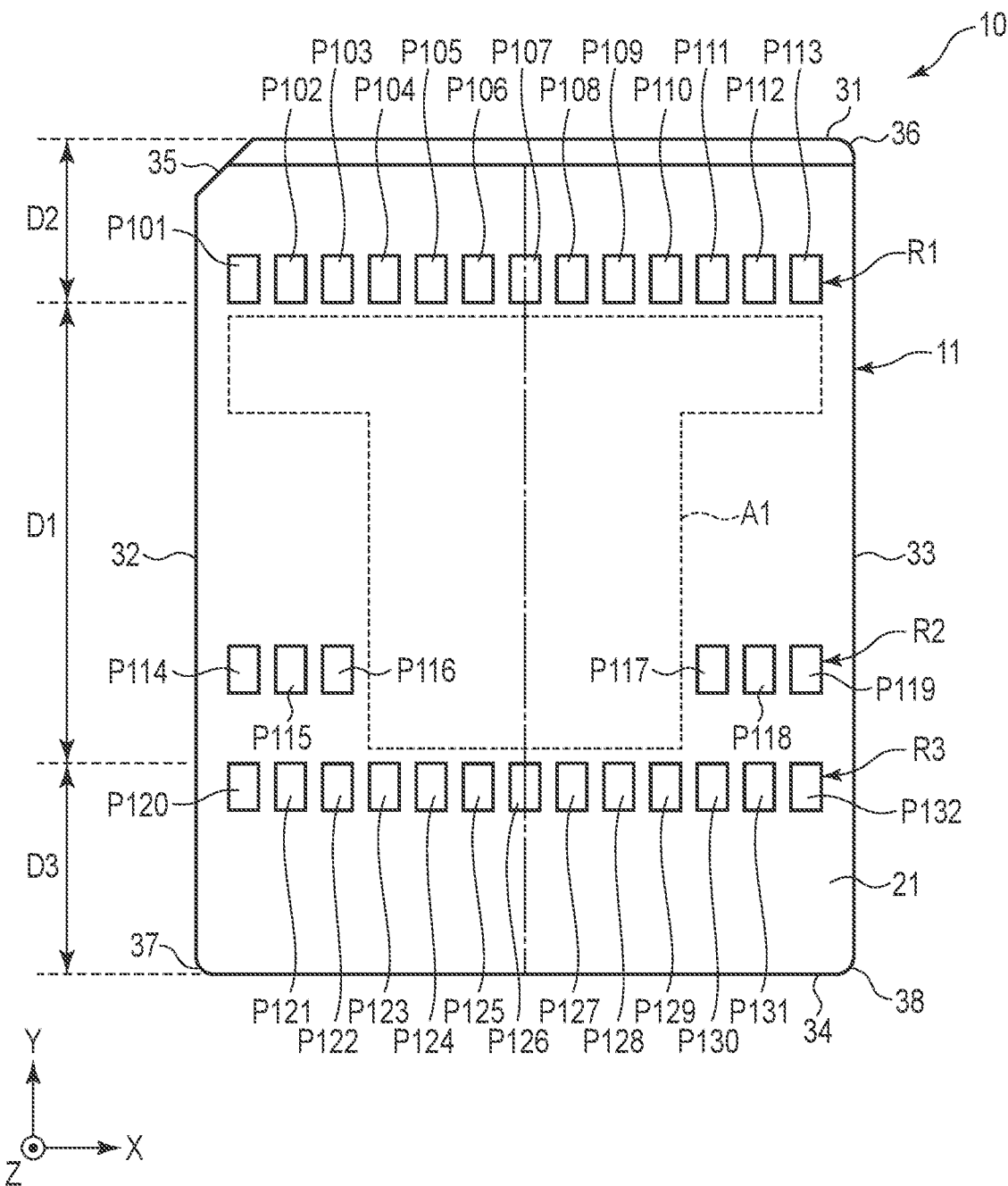
FIG. 21 is a diagram illustrating an example of a package in a case where the memory device according to the embodiment is realized as a removable memory device.

Next, a structure of a package applied to the memory device 10 will be described. FIG. 21 is a diagram illustrating an example of a package in a case where the memory device 10 is realized as a removable memory device.

The package (body) 11 of the memory device 10 is formed into, for example, a substantially rectangular plate shape elongated in a Y-axis direction. The Y-axis direction is the longitudinal direction of the memory device 10 and the package 11. The outer edge of the package (body) 11 has a first edge 31, a second edge 32, a third edge 33, a fourth edge 34, a first corner 35, a second corner 36, a third corner 37, and a fourth corner 38.

The first edge 31 extends in an X-axis direction and faces the positive direction along the Y-axis. The second edge 32 extends in the Y-axis direction and faces the negative direction along the X-axis. The third edge 33 is located opposite to the second edge 32, extends in the Y-axis direction, and faces the positive direction along the X-axis. The fourth edge 34 is located opposite to the first edge 31, extends in the X-axis direction, and faces the negative direction along the Y-axis.

The second edge 32 and the third edge 33 are longer than the first edge 31 and the fourth edge 34, respectively. The first edge 31 and the fourth edge 34 form short sides of the memory device 10 of the substantially rectangular shape, while the second edge 32 and the third edge 33 form long sides (lateral sides) of the memory device 10 of the substantially rectangular shape.

The first corner 35 is a corner between the first edge 31 and the second edge 32, connecting an end of the first edge 31 in the negative direction along the X axis to an end of the second edge 32 in the positive direction along the Y axis.

The first corner 35 extends linearly between the end of the first edge 31 in the negative direction along the X axis and the end of the second edge 32 in the positive direction along the Y axis. The corner between the first edge 31 and the second edge 32 is set as a so-called corner chamfering of C1.1 (C chamfering) to form the first corner 35. In other words, the first corner 35 is a chamfered part C formed between the first edge 31 and the second edge 32.

The second corner 36 is a corner between the first edge 31 and the third edge 33, connecting an end of the first edge 31 in the positive direction along the X axis to an end of the third edge 33 in the positive direction along the Y axis. The second corner 36 extends in an arc shape between the end of the first edge 31 in the positive direction along the X axis and the end of the third edge 33 in the positive direction along the Y axis. The corner between the first edge 31 and the third edge 33 is set as a so-called round chamfering of R0.2 (R chamfering) to form the second corner 36.

The third corner 37 connects an end of the second edge 32 in the negative direction along the Y axis to an end of the fourth edge 34 in the negative direction along the X axis. The fourth corner 38 connects an end of the third edge 33 in the negative direction along the Y axis to an end of the fourth edge 34 in the positive direction along the X axis. Each of the third corner 37 and the fourth corner 38 extends in an arc shape, as does the second corner 36.

The package 11 may have its length in the Y-axis direction set to about 18±0.10 mm, its length in the X-axis direction set to about 14±0.10 mm, and its thickness in the Z-axis direction set to about 1.4 mm±0.10 mm.

On the first surface 21 of the memory device 10, the plurality of terminals P may be arranged into three rows: a first row R1, a second row R2, and a third row R3. In the first row R1, for example, signal terminals for two lanes for a high-speed serial interface, such as PCI Express (registered trademark) (PCIe), are arranged.

FIG. 21 illustrates a case where the memory device 10 has 32 terminals P. The number of terminals P, however, is not limited to 32, which is merely an exemplary case. The number of terminals P may be smaller than 32 or larger than 32.

The plurality of terminals P are arranged into three rows, thus forming the first row R1, the second row R2, and the third row R3. A terminal group P belonging to the first row R1 is used, for example, as signal terminals for transmitting differential signal pairs for two lanes conforming to the PCIe standards. A terminal group P belonging to the second row R2 may be used as signal terminals for optional signals that vary depending on individual products. In terminal group belonging to the third row R3, signal terminals for control signals common to individual products and terminals for power are arranged. These terminals are used mainly as signal terminals for differential clock signals, signal terminals for common PCIe side band signals, power terminals, and signal terminals for other uses.

The first row R1 includes 13 terminals P101 to P113 which are spaced apart from each other and are arranged in the X-axis direction, at a location closer to the first edge 31 than to the fourth edge 34.

The terminals P101 to P113 are arranged in the X-axis direction along the first edge 31 at the location near the first edge 31.

The second row R2 includes 3 terminals P114 to P116 which are spaced apart from each other and are arranged in the X-axis direction, at a location closer to the fourth edge 34 than to the first edge 31. The second row R2 further includes 3 terminals P117 to P119 which are spaced apart from each other and are arranged in the X-axis direction, at a location closer to the fourth edge 34 than to the first edge 31

The terminals P114 to P116 are disposed between the center line (indicated by a single-dot chain line) of the memory device 10 and the second edge 32 in the X-axis direction, while the terminals P117 to P119 are disposed between the center line of the memory device 10 and the third edge 33 in the X-axis direction.

A spacing between the terminal P116 and the terminal P117 is wider than a spacing in the X direction between other adjacent terminals belonging to the row R2 (specifically, wider than a spacing between the terminal P114 and the terminal P115, a spacing between the terminal P115 and the terminal P116, a spacing between the terminal P117 and the terminal P118, and a spacing between the terminal P118 and the terminal P119.).

The third row R3 includes 13 terminals P120 to P132 which are spaced apart from each other and are arranged in the X-axis direction, at a location closer to the fourth edge 34 than to the first edge 31. The terminals P120 to P132 belonging to the third row R3 are arranged at a location closer to the fourth edge 34 than to the location where the terminals P114 to P119 belonging to the second row R2 are arranged.

A distance D1 between the first row R1 and the third row R3 in the Y-axis direction is longer than a distance D2 between the first row R1 and the first edge 31 in the Y-axis direction and a distance D3 between the third row R3 and the fourth edge 34 in the Y-axis direction.

The lengths in the Y-axis direction of the terminals P in the first row R1, the second row R2, and the third row R3 are set equal to each other. In other words, the terminals P in the first row R1, the second row R2, and the third row R3 are arranged such that respective ends of the terminals P in the negative direction along the Y axis are aligned with each other and respective ends of the terminals P in the positive direction along the Y axis are aligned with each other as well.

An area A1 indicated by a broken line in the first surface 21 functions as a contact area that is brought into contact with a TIM attached to the printed circuit board 201 of the host apparatus. Specifically, when the memory device 10 is attached to a connector on the printed circuit board 201, the terminals P on the first surface 21 contact with lead frames of the connector and the area A1 in the first surface 21 too contacts with the TIM attached to the printed circuit board 201. This sufficiently improves the efficiency of heat dissipation through heat conduction from the first surface 21 to the printed circuit board 201 of the host apparatus.

Figure 22:
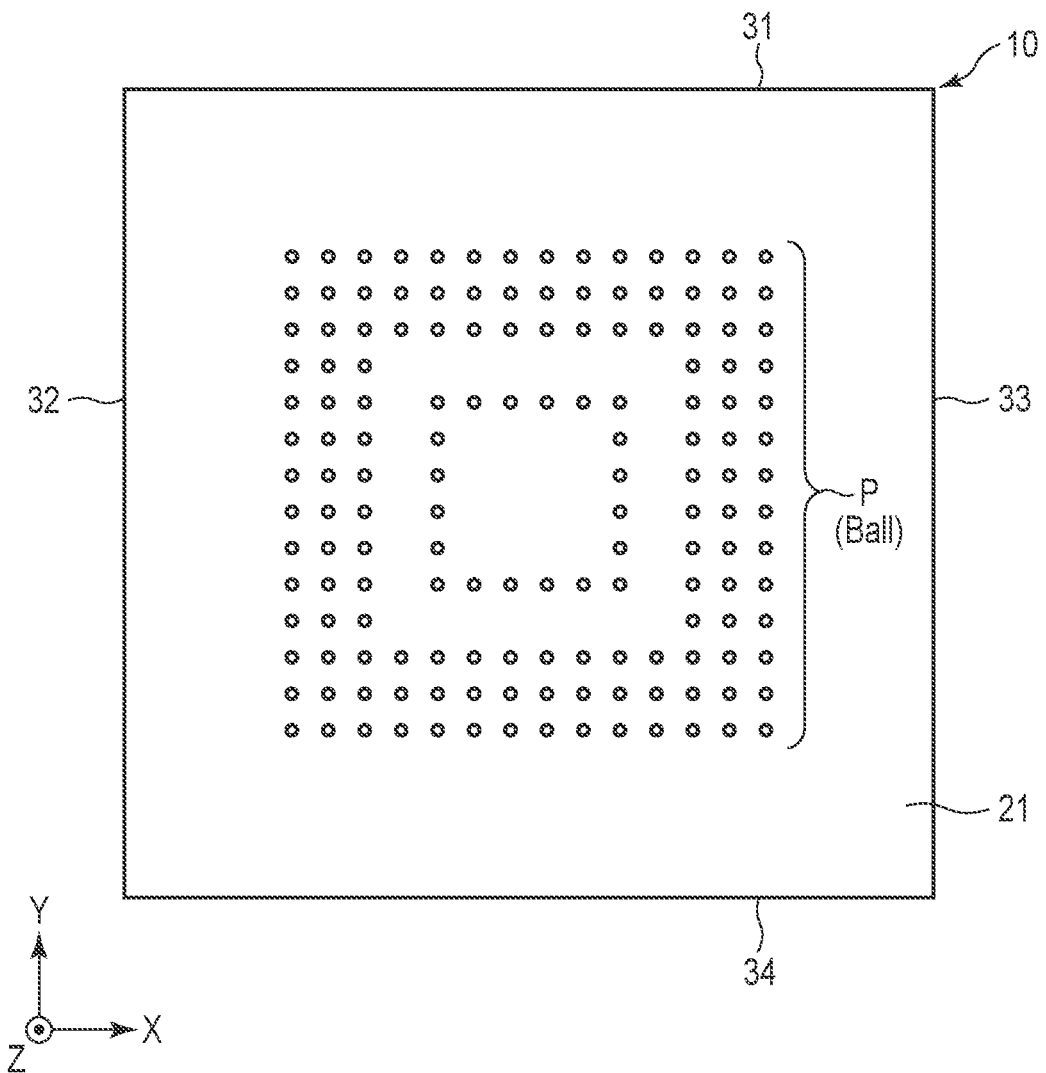
FIG. 22 is a diagram illustrating an example of a package in a case where the memory device according to the embodiment is provided as a surface mount memory device.

FIG. 22 is a diagram illustrating an example of a package in a case where the memory device 10 is realized as a surface mount memory device.

In FIG. 22, a BGA package is illustrated as a package of the surface mount memory device. The BGA package is an example of a surface mount package directly mounted on the printed circuit board 201 of the host apparatus. The controller 14 and the stacked NAND flash memory die 131 to 138 are incorporated in the BGA package. In addition, a plurality of balls are arranged as the terminals P on the first surface 21, as shown in FIG. 22.

As described above, according to this embodiment, the controller 14 reads temperatures measured by the temperature sensors TH_N0 to TH_N7 from the NAND flash memory dies 131 to 138, and uses the maximum temperature among the read temperatures measured by the temperature sensors TH_N0 to TH_N7, as Tj_N_max, thereby carrying out the thermal control. Now a case is assumed where, for example, the NAND flash memory 13 in the memory device 10 includes a first NAND flash memory die and a second NAND flash memory die stacked above the first NAND flash memory die. In this case, the controller 14 reads a temperature measured by a first temperature sensor built in the first NAND flash memory die and a temperature measured by a second temperature sensor incorporated in the second NAND flash memory die, from the first NAND flash memory die and the second NAND flash memory die, respectively. Then, when at least one of the temperatures read from the first and second NAND flash memory dies is equal to or higher than the threshold temperature, the controller 14 reduces the frequency of issue of commands to the first and second NAND flash memory dies or the speed of access to the first and second NAND flash memory dies.

In many cases, a temperature inside the controller 14 is higher than the temperature of each NAND flash memory die. If Tj_N_max is estimated by using a temperature measured by the temperature sensor TH_C in the controller 14, therefore, it leads to a tendency that the thermal control is started prematurely before Tj_N_max actually rises to the temperature at which the thermal control is to be started, causing an unnecessary degradation of the access performance of the NAND flash memory 13.

In this embodiment, by using the maximum temperature among temperatures measured by the temperature sensors TH_N0 to TH_N7, as Tj_N_max, a point of time of starting the thermal control is made later than a point of time of starting the thermal control in the case of estimating Tj_N_max using a temperature measured by the temperature sensor TH_C in the controller 14. As a result, a time during which the NAND flash memory dies 131 to 138 operate in their maximum access performance can be increased. Therefore, the temperature of each of the NAND flash memory dies 131 to 138 can be prevented from exceeding the upper limit of the operation guarantee temperature of the NAND flash memory die, without causing an unnecessary degradation of the access performance of the memory device 10.

In addition, the controller 14 is allowed to carry out the thermal control by reading only the temperatures measured by N-1 or less temperature sensors in N-1 or less NAND flash memory dies selected as temperature monitoring target dies, from N NAND flash memory dies stacked in the package 11.

This makes it possible to quickly search for the highest temperature among the temperatures of the N NAND flash memory dies stacked in the package 11. In addition, quickly searching for the highest temperature reduces the number of times of read access necessary for reading temperatures, which improves access performance related to reading/writing user data. For example, a case is assumed where the NAND flash memory 13 in the memory device 10 includes a third NAND flash memory die, in addition to the first and second NAND flash memory dies described above, the first NAND flash memory die is stacked above the third NAND flash memory die, and the third NAND flash memory die is closer to the first surface 21 than the first and second NAND flash memory dies. In this case, the controller 14 reads a temperature measured by a first temperature sensor built in the first NAND flash memory die and a temperature measured by a second temperature sensor incorporated in the second NAND flash memory die, from the first NAND flash memory die and the second NAND flash memory die, respectively. Then, when at least one of the temperatures read from the first and second NAND flash memory dies is equal to or higher than the threshold temperature, the controller 14 reduces the frequency of issue of commands to the first and second NAND flash memory dies or the speed of access to the first and second NAND flash memory dies. In other words, the controller 14 does not read a temperature measured by the third temperature sensor incorporated in the third NAND flash memory die, from the third NAND flash memory die, or does not compare the temperature measured by the third temperature sensor with the threshold value.

N-1 or less nonvolatile memory dies that are the temperature monitoring target dies can be decided by learning in advance respective temperatures of the stacked NAND flash memory dies 131 to 138 in a period in which the NAND flash memory dies 131 to 138 are accessed. By this approach, N-1 or less nonvolatile memory dies that are the temperature monitoring target dies can be determined highly accurately. For example, when the NAND flash memory 13 in the memory device 10 is configured to include the above first, second, and third NAND flash memory dies, the controller 14 stores information for identifying the first and second NAND flash memory dies.

In this embodiment, the stacked NAND flash memory dies 131 to 138 each store a correction value non-volatilely, the correction value being determined such that a temperature output of the temperature sensor TH_N is within a predetermined allowable temperature range at the first temperature (70° C. or 85° C.) higher than the room temperature (30° C.), the predetermined allowable temperature range being set with respect to the first temperature (70° C. or 85° C.). In addition, each temperature sensor TH_N is configured to operate using correction values non-volatilely stored in the corresponding NAND flash memory die. Hence a temperature measurement error of each temperature sensor TH_N can be reduced in a temperature range in which the thermal control is carried out. For example, according to a method for manufacturing the memory device 10 including the controller 14 and the first and second NAND flash memory dies, a wafer including the first and second NAND flash memory dies is prepared first. Subsequently, the ambient temperature around the wafer is set to a first set value. As described with reference to FIG. 18, the first set value is, for example, 70° C.±1.25° C., that is, a temperature range of 68.75° C. or higher and 71.25° C. or lower, or is 85° C.±1.25° C., that is, a temperature range of 83.75° C. or higher and 86.25° C. or lower. After the ambient temperature is set to the first set value, a first temperature is measured using the first temperature sensor. A first correction value that the first temperature sensor uses for temperature measurement is determined, using a measurement value of the first temperature sensor. The determined first correction value is written to a first nonvolatile memory die. In the same manner, after the ambient temperature is set to the first set value, a second temperature is measured, using the second temperature sensor. A second correction value that the second temperature sensor uses for temperature measurement is determined, using a measurement value of the second temperature sensor. The determined second correction value is written to a second nonvolatile memory die. Then, the ambient temperature is set to a second set value (e.g., 90° C.±1.25° C.) higher than the first set value. After the ambient temperature is set to the second set value, a third temperature is measured, using the first temperature sensor. After the ambient temperature is set to the second set value, a fourth temperature is measured, using the second temperature sensor. Then, whether the third temperature and the fourth temperature are each within a threshold range is determined. Thereafter, the first and second nonvolatile memory dies are cut out from the wafer. When the third temperature and the fourth temperature are each within the threshold range, the cut-out first and second nonvolatile memory dies are packaged in the memory devices 10. Hence the memory device 10 in which the controller 14 and the first and second nonvolatile memory dies are incorporated in one package 11 is manufactured.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A memory device comprising:
   a first nonvolatile memory die;
   a second nonvolatile memory die stacked above the first nonvolatile memory die;
   a third nonvolatile memory die;
   a controller configured to control the first, second, and third nonvolatile memory dies;
   a first temperature sensor, a second temperature sensor, and a third temperature sensor incorporated respectively in the first nonvolatile memory die, the second nonvolatile memory die, and the third nonvolatile memory die;
   a first surface;
   a second surface located opposite to the first surface; and
   a plurality of terminals exposed on the first surface, wherein
   the first nonvolatile die is stacked above the third nonvolatile die,
   the third nonvolatile die is closer to the first surface than the first and second nonvolatile dies,
   the controller is configured to:
   decide not to read a temperature measured by the third temperature sensor, or not to compare the temperature with a threshold temperature, by learning in advance temperature tendencies of the first, second, and third nonvolatile dies in a period in which access to the first, second, and third nonvolatile memory dies is in progress;
   read temperatures measured by the first and second temperature sensors, from the first and second nonvolatile memory dies; and
   when at least one of temperatures read from the first and second nonvolatile memory dies is equal to or higher than the threshold temperature, reduce a frequency of issue of commands to the first, second, and third nonvolatile memory dies or a speed of access to the first, second, and third nonvolatile memory dies.

2. The memory device according to claim 1, wherein the controller is configured to store information for identifying the first and second nonvolatile memory dies from which temperatures are to be read.

3. The memory device according to claim 1, wherein the threshold temperature is set to a temperature higher than 30° C.,
   the first, second, and third nonvolatile memory dies store a first, second, and third correction values, non-volatilely respectively, the correction values being determined such that temperature outputs of the first, second, and third temperature sensors are each within a predetermined allowable temperature range at a first temperature higher than 30° C., the predetermined allowable temperature range being set with respect to the first temperature,
   the first, second, and third correction values are determined before the first, second, and third nonvolatile memory dies are packaged, and
   the first, second, and third temperature sensors are configured to use the first, second, and third correction values, respectively.

4. The memory device according to claim 3, wherein the first temperature is set to an upper limit of an operation guarantee temperature of each of the first, second, and third nonvolatile memory dies.

5. The memory device according to claim 3, wherein the first correction value includes a first gradient and a first intercept of an approximate straight line obtained from temperature characteristics of the first nonvolatile memory die,
   the second correction value includes a second gradient and a second intercept of an approximate straight line obtained from temperature characteristics of the second nonvolatile memory die, and
   the third correction value includes a third gradient and a third intercept of an approximate straight line obtained from temperature characteristics of the third nonvolatile memory die.

6. The memory device according to claim 1, wherein each of the first, second, and third nonvolatile memory dies is a NAND flash memory die.

7. The memory device according to claim 1, wherein the memory device is a removable memory device that is attachable to a connector disposed on a printed circuit board of a host apparatus.

8. The memory device according to claim 1, wherein
the memory device is a surface mount memory device that is mounted on a printed circuit board of a host apparatus.

9. The memory device according to claim 1, further comprising a package, wherein
the first, second, and third nonvolatile memory dies and the controller are incorporated in the package.

10. A controlling method of controlling a memory device including: a first nonvolatile memory die; a second nonvolatile memory die stacked above the first nonvolatile memory die; a third nonvolatile memory die; first, second, and third temperature sensors incorporated respectively in the first, second, and third nonvolatile memory dies; a first surface; a second surface located opposite to the first surface; and a plurality of terminals exposed on the first surface, wherein
the first nonvolatile memory die is stacked above the third nonvolatile memory die, and
the third nonvolatile memory die is closer to the first surface than the first and second nonvolatile memory dies,
the method comprises:
deciding not to read a temperature measured by the third temperature sensor, or not to compare the temperature with a threshold temperature, by learning in advance temperature tendencies of the first, second, and third nonvolatile memory dies in a period in which access to the first, second, and third nonvolatile memory dies is in progress;
measuring first, second, and third temperatures, using the first, second, and third temperature sensors;
reading a measurement of the first temperature and a measurement of the second temperature from the first nonvolatile memory die and the second nonvolatile memory die; and
when at least one of the measurement of the first temperature and the measurement of the second temperature is equal to or higher than the threshold temperature, reducing a frequency of issue of commands to the first, second, and third nonvolatile memory dies or a speed of access to the first, second, and third nonvolatile memory dies.

11. The controlling method according to claim 10, wherein
the threshold temperature is set to a temperature higher than 30° C.,
the first, second, and third nonvolatile memory dies store first, second, and third correction values, non-volatilely respectively, the correction values being determined such that temperature outputs of the first, second, and third temperature sensors are each within a predetermined allowable temperature range at a fourth temperature higher than 30° C., the predetermined allowable temperature range being set with respect to the fourth temperature;
the first, second, and third correction values are determined before packaging the first, second, and third nonvolatile memory dies; and
the first, second, and third temperatures are measured using the first, second, and third correction values, respectively.

12. A memory device manufacturing method comprising:
preparing a wafer including a first nonvolatile memory die that includes a first temperature sensor, a second nonvolatile memory die that includes a second temperature sensor, and a third nonvolatile memory die that includes a third temperature sensor;
setting an ambient temperature around the wafer to a first set value higher than 30° C.;
after setting the ambient temperature to the first set value, measuring a first temperature, using the first temperature sensor;
determining a first correction value, using a measurement value of the first temperature sensor, the first correction value being used for temperature measurement by the first temperature sensor;
writing the first correction value to the first nonvolatile memory die;
after setting the ambient temperature to the first set value, measuring a second temperature, using the second temperature sensor;
determining a second correction value, using a measurement value of the second temperature sensor, the second correction value being used for temperature measurement by the second temperature sensor;
writing the second correction value to the second nonvolatile memory die;
after setting the ambient temperature to the first set value, measuring a third temperature, using the third temperature sensor;
determining a third correction value, using a measurement value of the third temperature sensor, the third correction value being used for temperature measurement by the third temperature sensor;
writing the third correction value to the third nonvolatile memory die;
setting the ambient temperature to a second set value higher than the first set value;
after setting the ambient temperature to the second set value, measuring a fourth temperature, using the first temperature sensor;
after setting the ambient temperature to the second set value, measuring a fifth temperature, using the second temperature sensor;
after setting the ambient temperature to the second set value, measuring a sixth temperature, using the third temperature sensor;
determining whether or not the fourth, fifth, and sixth temperatures are each within a threshold range;
cutting out the first, second, and third nonvolatile memory dies from the wafer;
when the fourth, fifth, and sixth temperatures are each within the threshold range, packaging the cut out first, second, and third nonvolatile memory dies as a memory device such that the first, second, and third nonvolatile memory dies are stacked, wherein a first surface, a second surface located opposite to the first surface, and a plurality of terminals exposed on the first surface are included in the memory device, the first nonvolatile memory die is stacked above the third nonvolatile memory die, the second nonvolatile memory die is stacked above the first nonvolatile memory die, and the third nonvolatile memory die is located closer to the first surface than the first and second nonvolatile memory dies; and
after the first, second, and third nonvolatile memory dies are packaged, deciding not to read a temperature measured by the third temperature sensor, or not to compare the temperature with a threshold temperature, by learning temperature tendencies of the first, second, and third nonvolatile memory dies, wherein
in the memory device, temperatures measured by the first and second temperature sensors are read from the first and second nonvolatile memory dies, and when at least one of the temperatures read from the first and second nonvolatile memory dies is equal to or higher than the threshold temperature, a frequency of issue of commands to the first, second, and third nonvolatile memory dies or a speed of access to the first, second, and third nonvolatile memory dies is reduced.

\* \* \* \* \*